US008680490B2

(12) United States Patent
Kwag et al.

(10) Patent No.: US 8,680,490 B2
(45) Date of Patent: Mar. 25, 2014

(54) SOLAR CELL, SOLAR CELL MANUFACTURING DEVICE, AND METHOD FOR MANUFACTURING THE SAME

(71) Applicant: LG Electronics Inc., Seoul (KR)

(72) Inventors: Gyeayoung Kwag, Seoul (KR); Sungbong Ma, Seoul (KR); Sungyeon Cho, Seoul (KR); Myungjun Shin, Seoul (KR); Taeyoung Kwon, Seoul (KR); Haejong Cho, Seoul (KR)

(73) Assignee: LG Electronics Inc., Seoul (KR)

( * ) Notice: Subject to any disclaimer, the term of this patent is extended or adjusted under 35 U.S.C. 154(b) by 29 days.

(21) Appl. No.: 13/626,707

(22) Filed: Sep. 25, 2012

(65) Prior Publication Data

US 2013/0186457 A1 Jul. 25, 2013

(30) Foreign Application Priority Data

Jan. 19, 2012 (KR) .................. 10-2012-0006199

(51) Int. Cl.
*H01J 37/317* (2006.01)
(52) U.S. Cl.
CPC ............................ *H01J 37/3171* (2013.01)
USPC .................................................. 250/492.21

(58) Field of Classification Search
USPC .............. 250/492.21; 438/98, 87; 118/665; 257/E31.124
See application file for complete search history.

(56) References Cited

U.S. PATENT DOCUMENTS

2012/0040490 A1* 2/2012 Gallazzo et al. ............... 438/87
2012/0100666 A1* 4/2012 Gee et al. ....................... 438/98

* cited by examiner

*Primary Examiner* — Kiet T Nguyen
(74) *Attorney, Agent, or Firm* — Birch, Stewart, Kolasch & Birch, LLP

(57) ABSTRACT

A solar cell, a solar cell manufacturing device, and a method for manufacturing the solar cell are discussed. The solar cell manufacturing device includes a chamber; an ion implantation unit configured to implant ions into a substrate inside the chamber and a mask positioned between the ion implantation unit and the substrate. The mask includes a first opening to form a lightly doped region having a first concentration at one surface of the substrate, a second opening to form a heavily doped region having a second concentration higher than the first concentration at the one surface of the substrate, and at least one connector formed to cross the second opening. The second opening includes finger openings formed in a first direction, and bus openings formed in a second direction crossing the first direction.

10 Claims, 21 Drawing Sheets

|  | Voc | Isc | FF |
|---|---|---|---|
| Comparative example (1) | ○ | △ | △ |
| Comparative example (2) | ○ | ○ | ○ |
| Comparative example (3) | ○ | ◎ | ◎ |
| Present invention | ○ | ◎ | ◎ |

△:Normal   ○:Good   ◎:Excellent

SOLAR CELL, SOLAR CELL MANUFACTURING DEVICE, AND METHOD FOR MANUFACTURING THE SAME

This application claims priority to and the benefit of Korean Patent Application No. 10-2012-0006199 filed in the Korean Intellectual Property Office on Jan. 19, 2012, the entire contents of which are incorporated herein by reference.

BACKGROUND OF THE INVENTION

1. Field of the Invention

Embodiments of the invention relate to a solar cell, a solar cell manufacturing device, and a method for manufacturing the solar cell.

2. Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type and thus form a p-n junction, and electrodes respectively connected to the semiconductor parts of the different conductive types.

In some instances, an emitter region of a solar cell has a selective emitter structure including a lightly doped region having a relatively small depth of the p-n junction and a heavily doped region having a relatively large depth of the p-n junction, so as to improve photoelectric conversion efficiency of the solar cell.

Examples of a method for forming the selective emitter structure of the solar cell include a thermal diffusion method performed in a thermal diffusion furnace using a mask, a partial thermal diffusion method using a laser, and a method using an ion implantation device for implanting ion particles, which are accelerated at a high energy, into one surface of a silicon substrate.

In a related art method for forming the selective emitter structure using the ion implantation device, a mask is disposed between ions and the silicon substrate so as to implant ions only into a desired region of the silicon substrate, thereby selectively filtering the ions.

SUMMARY OF THE INVENTION

In one aspect, there is a solar cell manufacturing device including a chamber; an ion implantation unit which is positioned inside the chamber and configured to implant ions into one surface of a substrate positioned inside the chamber, and a mask positioned between the ion implantation unit and the substrate, the mask including a first opening to form a lightly doped region having a first concentration at the one surface of the substrate, a second opening to form a heavily doped region having a second concentration higher than the first concentration at the one surface of the substrate, and at least one connector formed to cross the second opening, wherein the second opening includes a plurality of finger openings formed in a first direction, and a plurality of bus openings which are formed in a second direction crossing the first direction and are connected to the finger openings.

The mask may further include an edge surrounding the first opening and the second opening, and a plurality of centers surrounded by the plurality of finger openings and the plurality of bus openings.

The at least one connector of the mask may include first connectors connecting the edge to the plurality of centers and second connectors connecting directly adjacent centers to each other.

The first connectors and the second connectors may be formed to cross at least one of the finger openings and the bus openings. The first connectors and the second connectors may be positioned between the two directly adjacent finger openings or between the two directly adjacent bus openings.

A width of the first connectors may be equal to or less than a width of the finger openings.

At least one first connector and at least one second connector may be positioned between two directly adjacent finger openings.

At least one first connector and at least one second connector may be positioned between two directly adjacent bus openings.

The number of the second connectors may be more than the number of the first connectors.

In another aspect, there is a method for manufacturing a solar cell using the above-described solar cell manufacturing device including implanting the ions into the substrate while the ion implantation unit moves over the first opening of the mask in the first direction in a state where the substrate is disposed under the first opening of the mask to form the lightly doped region at the one surface of the substrate, moving the substrate in the first direction to position the substrate under the second opening of the mask, and implanting the ions into the substrate while the ion implantation unit moves over the second opening of the mask in the first direction to simultaneously form the heavily doped region extending in the first direction and the heavily doped region extending in the second direction crossing the first direction at the one surface of the substrate at which the lightly doped region is formed.

In yet another aspect, there is a method for manufacturing a solar cell using the above-described solar cell manufacturing device including simultaneously moving the substrate and the mask in the first direction while the ion implantation unit is stationary to implant the ions into the substrate in a state where the substrate is disposed under the first opening of the mask to form the lightly doped region at the one surface of the substrate, moving the substrate in an opposite direction to the first direction while the mask is stationary to position the substrate under the second opening of the mask, and simultaneously moving the substrate and the mask in the first direction while the ion implantation unit is stationary to implant the ions into the substrate in a state where the substrate is disposed under the second opening of the mask to simultaneously form the heavily doped region extending in the first direction and the heavily doped region extending in the second direction crossing the first direction at the one surface of the substrate at which the lightly doped region is formed.

In still yet another aspect, there is a solar cell including a substrate doped with impurities of a first conductive type, an emitter region which is positioned at one surface of the substrate and is doped with impurities of a second conductive type opposite the first conductive type to form a p-n junction along with the substrate, the emitter region including a lightly doped region having a first concentration of the second conductive type impurities and heavily doped regions having a second concentration of the second conductive type impurities higher than the first concentration, a first electrode positioned on the emitter region, the first electrode including finger electrodes disposed in a first direction and front bus bars disposed in a second direction crossing the first direction, a second electrode positioned on the other surface of the substrate, and middle doped regions positioned in portions between the heavily doped regions to cross the heavily doped regions, the middle doped regions having a third concentration lower than the second concentration of the heavily doped region.

The third concentration of the middle doped regions may be lower than the second concentration of the heavily doped regions and may be equal to or higher than the first concentration of the lightly doped region.

The heavily doped regions may include finger doped regions, which overlap the finger electrode and extend in the first direction, and bus bar doped regions which overlap the front bus bar and extend in the second direction. The middle doped regions may be positioned in portions between the bus bar doped regions to cross the bus bar doped regions. The middle doped region may be positioned in a portion between the finger doped regions to cross the finger doped regions.

A width of the middle doped regions positioned in portions between the bus bar doped regions as measured in the first direction may be substantially equal to a width of the bus bar doped region. A width of the middle doped regions positioned in a portion between the bus bar doped regions as measured in the second direction may be equal to or less than a width of the finger doped region.

A thickness of the middle doped regions may be greater than a thickness of the lightly doped region and may be less than a thickness of the heavily doped region.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts. It should be noted that detailed descriptions of known arts will be omitted if it is determined that such detailed descriptions of the known arts would lead to obscuring of the embodiments of the invention.

FIGS. 1 to 5 illustrate a structure of a solar cell according to an example embodiment of the invention.

Figure 1:
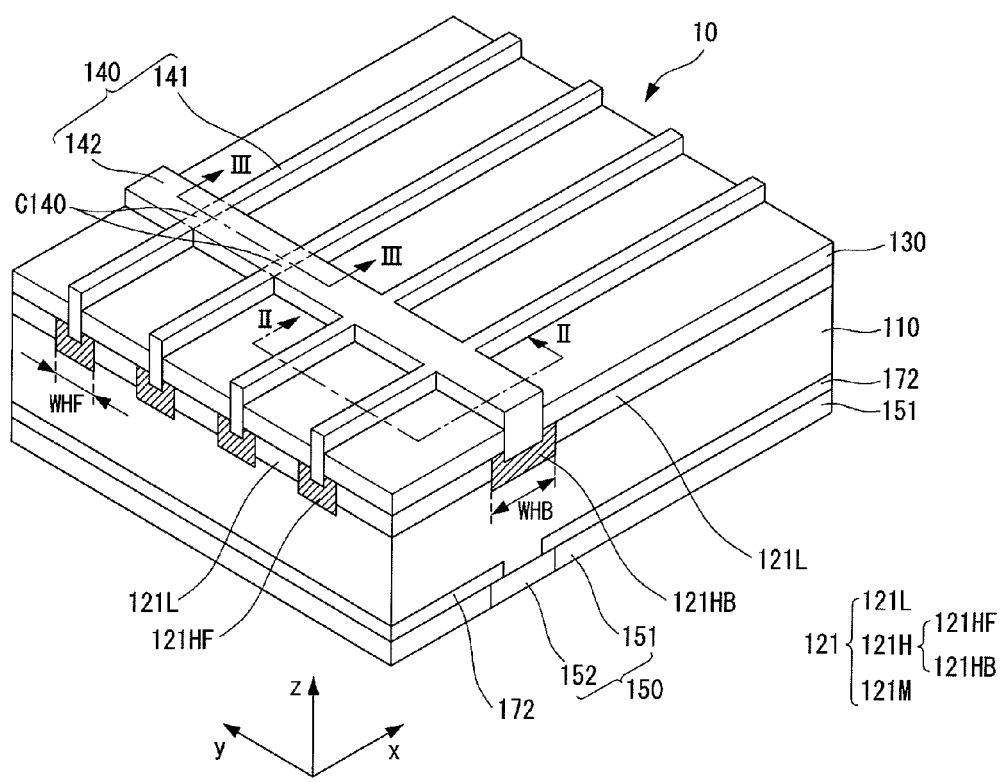
FIG. 1 is a partial perspective view of a solar cell according to an example embodiment of the invention.
Figure 2:
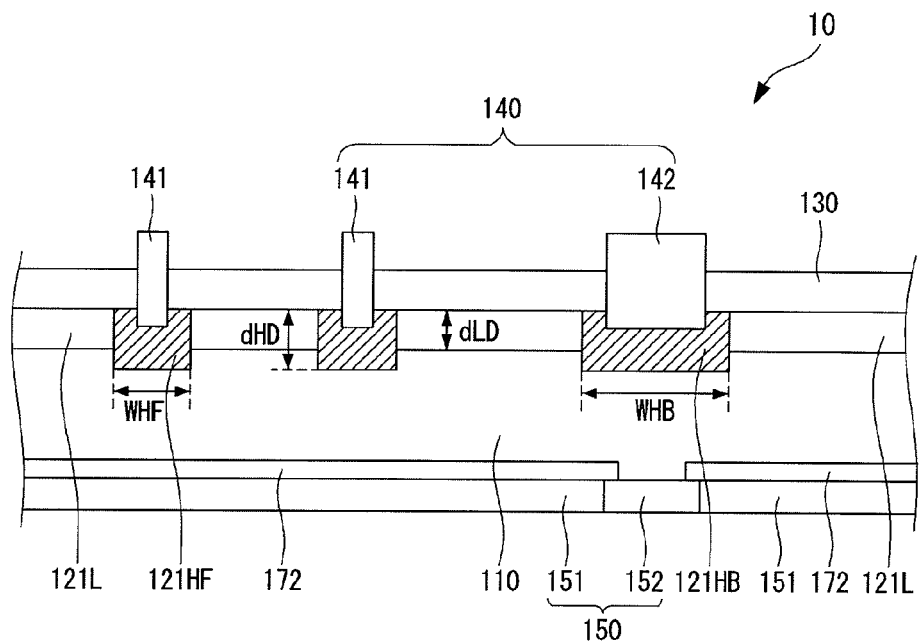
FIG. 2 is a cross-sectional view taken along line II-II of FIG. 1.
Figure 3:
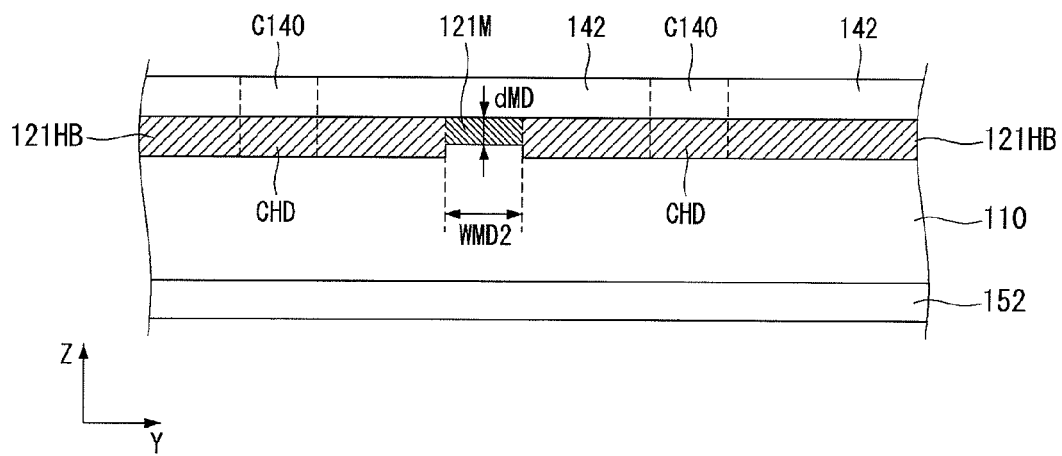
FIG. 3 is a cross-sectional view taken along line of FIG. 1.
Figure 4:
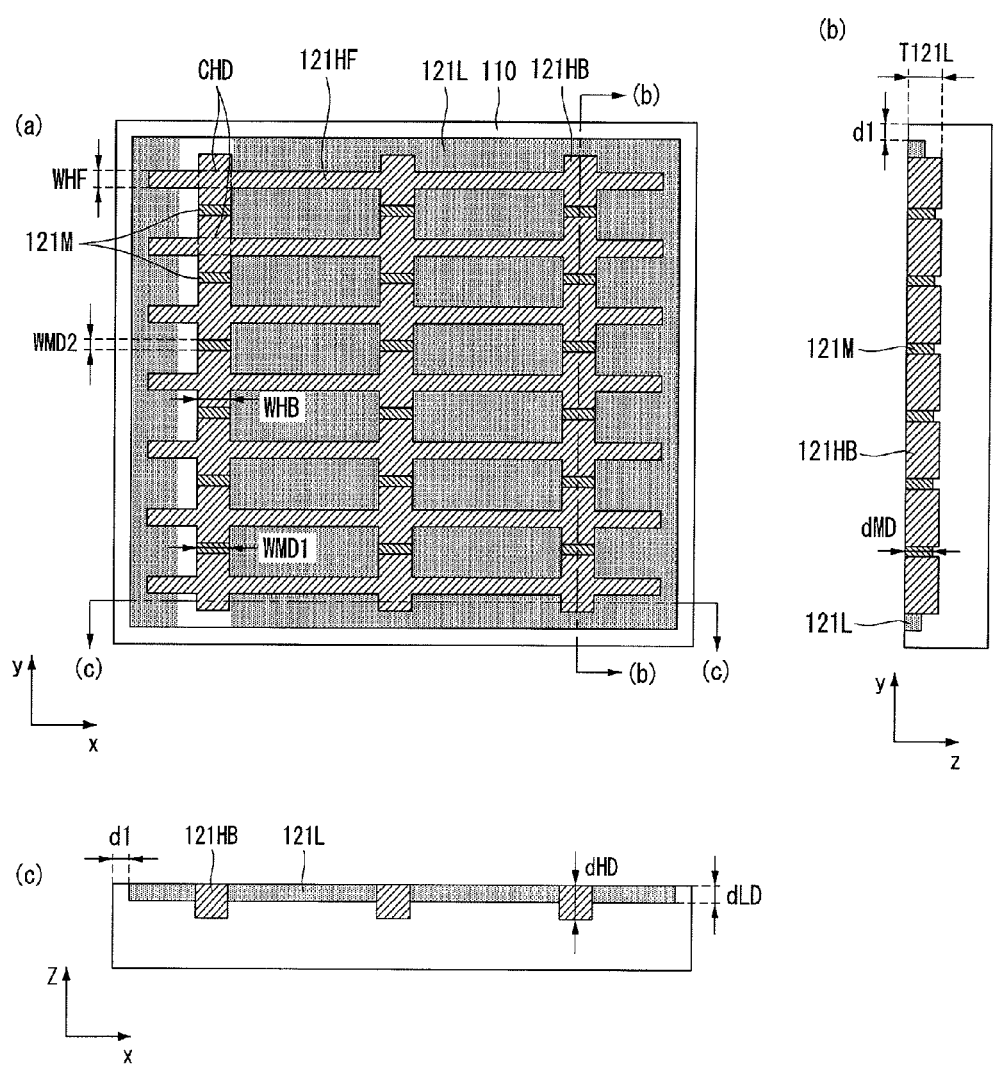
FIG. 4 shows a solar cell according to the example embodiment of the invention, where (a) of FIG. 4 is a plane view showing a selective emitter structure formed on the entire surface of a substrate of a solar cell according to an example embodiment of the invention, (b) of FIG. 4 is a cross-sectional view taken along line (b)-(b) of (a) of FIG. 4, and (c) of FIG. 4 is a cross-sectional view taken along line (c)-(c) of (a) of FIG. 4.

More specifically, FIG. 1 is a partial perspective view of a solar cell according to an example embodiment of the invention. FIG. 2 is a cross-sectional view taken along line II-II of FIG. 1. FIG. 3 is a cross-sectional view taken along line of FIG. 1. FIG. 4 shows a solar cell according to the example embodiment of the invention, where (a) of FIG. 4 is a plane view showing a selective emitter structure formed on the entire surface of a substrate of a solar cell according to an example embodiment of the invention, (b) of FIG. 4 is a cross-sectional view taken along line (b)-(b) of (a) of FIG. 4, and (c) of FIG. 4 is a cross-sectional view taken along line (c)-(c) of (a) of FIG. 4.

As shown in FIGS. 1 to 3, a solar cell 10 according to an embodiment of the invention includes a substrate 110, an emitter region 121 positioned at an incident surface (hereinafter, referred to as "a front surface") of the substrate 110 on which light is incident, an anti-reflection layer 130 positioned on the emitter region 121, a first electrode 140 positioned on the emitter region 121, a back surface field region 172 positioned at a surface (hereinafter, referred to as "a back surface") opposite the incident surface of the substrate 110, and a second electrode 150 positioned on the back surface field region 172 and the substrate 110.

The substrate 110 is a semiconductor substrate formed of a semiconductor such as first conductive type silicon, for example, p-type silicon, though not required. The semiconductor used in the substrate 110 is a crystalline semiconductor, such as single crystal silicon or polycrystalline silicon.

When the substrate 110 is of the p-type, the substrate 110 is doped with impurities of a group III element such as boron (B), gallium (Ga), and indium (In). Alternatively, the substrate 110 may be of an n-type and/or may be formed of a semiconductor material other than silicon. If the substrate 110 is of the n-type, the substrate 110 may be doped with impurities of a group V element such as phosphorus, (P), arsenic (As), and antimony (Sb).

The front surface of the substrate 110 may be textured to form a textured surface corresponding to an uneven surface having a plurality of uneven portions or having uneven characteristics. Thus, the anti-reflection layer 130 on the front surface of the substrate 110 may have the textured surface. In addition, the back surface as well as the front surface of the substrate 110 may have the textured surface. A surface area of the substrate 110 increases due to the textured surface having the plurality of uneven portions, and an incident area of light increases. Hence, an amount of light reflected by the substrate 110 decreases, and an amount of light incident on the substrate 110 increases.

The emitter region 121 positioned at the front surface of the substrate 110 is an impurity doped region doped with impurities of a second conductive type (for example, n-type) opposite the first conductive type (for example, p-type) of the substrate 110. Thus, the emitter region 121 of the second conductive type forms a p-n junction along with a first conductive type region (for example, a p-type region) of the substrate 110.

As shown in FIG. 1, the emitter region 121 includes a lightly doped region 121L and a heavily doped region 121H. The lightly doped region 121L has a first concentration of the second conductive type impurities, and the heavily doped region 121H has a second concentration of the second conductive type impurities higher than the first concentration. Namely, the heavily doped region 121H is more heavily doped than the lightly doped region 121L.

The anti-reflection layer 130 may be positioned on the lightly doped region 121L, and the first electrode 140 may be positioned on the heavily doped region 121H.

Sheet resistances of the lightly doped region 121L and the heavily doped region 121H are different from each other because of a difference between the impurity doping concentrations of the lightly doped region 121L and the heavily doped region 121H. The sheet resistance of the lightly doped region 121L is greater, than the sheet resistance of the heavily doped region 121H.

For example, the sheet resistance of the lightly doped region 121L may be about 100 Ω/sq. to 120 Ω/sq., and the sheet resistance of the heavily doped region 121H may be about 30 Ω/sq. to 50 Ω/sq.

Accordingly, the emitter region 121 according to the embodiment of the invention has a selective emitter structure including the lightly doped region 121L and the heavily doped region 121H each having different sheet resistances. In the embodiment of the invention, the selective emitter structure may be formed using an ion implantation method. This will be described in detail later.

Regarding carriers, for example, electrons and holes produced by light incident on the substrate 110, the electrons and the holes respectively move to the n-type semiconductor and the p-type semiconductor by a built-in potential difference resulting from the p-n junction between the substrate 110 and the emitter region 121. Thus, when the substrate 110 is of the p-type and the emitter region 121 is of the n-type, the holes and the electrons move to the back surface of the substrate 110 and the emitter region 121, respectively.

Because the emitter region 121 forms the p-n junction along with the first conductive type region of the substrate 110, the emitter region 121 may be of the p-type if the substrate 110 is of the n-type, in another embodiment of the invention. In this instance, the electrons move to the back surface of the substrate 110 and the holes move to the emitter region 121.

Returning to the embodiment of the invention, when the emitter region 121 is of the n-type, the emitter region 121 may be doped with impurities of a group V element such as P, As, and Sb. On the contrary, when the emitter region 121 is of the p-type, the emitter region 121 may be doped with impurities of a group III element such as B, Ga, and In.

When the sheet resistance of the lightly doped region 121L is about 100 Ω/sq. to 120 Ω/sq., an amount of light absorbed in the lightly doped region 121L further decreases. Hence, an amount of light incident on the substrate 110 increases, and a loss of carriers resulting from the impurities decreases.

Further, when the sheet resistance of the heavily doped region 121H is about 30 Ω/sq. to 50 Ω/sq., a contact resistance between the heavily doped region 121H and the first electrode 140 decreases. Hence, a loss of carriers resulting from the contact resistance decrease.

The heavily doped region 121H includes a plurality of finger doped regions 121HF and a plurality of bus bar doped regions 121HB.

The finger doped regions 121HF overlap finger electrodes 141 of the first electrode 140 and extend in a first direction 'x' (or an x-axis direction). The bus bar doped regions 121HB overlap front bus bars 142 of the first electrode 140 and extends in a second direction 'y' (or a y-axis direction). The finger doped regions 121HF and the bus bar doped regions 121HB have the same second concentration.

A thickness dHD of each of the finger doped region 121HF and the bus bar doped region 121HB of the heavily doped region 121H may be greater than a thickness dLD of the lightly doped region 121L. In this instance, generation of a shunt, in which the first electrode 140 passes through the heavily doped region 121H and contacts the substrate 110 in a thermal process of the first electrode 140, may be reduced because of the relatively thick thickness of the heavily doped region 121H.

The anti-reflection layer 130 positioned on the emitter region 121 may be formed of silicon nitride (SiNx), silicon oxide (SiOx), or silicon oxynitride (SiOxNy), etc.

The anti-reflection layer 130 reduces a reflectance of light incident on the solar cell 10 and increases selectivity of a predetermined wavelength band, thereby increasing the efficiency of the solar cell 10. Further, the anti-reflection layer 130 performs a passivation function which converts a defect, for example, dangling bonds existing at and around the surface of the substrate 110 into stable bonds using hydrogen (H) injected when the anti-reflection layer 130 is formed, thereby preventing or reducing a recombination and/or a disappearance of carriers moving to the surface of the substrate 110. Hence, an amount of carriers lost by the defect at and around the surface of the substrate 110 decreases, and the efficiency of the solar cell 10 is improved.

The anti-reflection layer 130 may include at least one layer. For example, FIGS. 1 and 2 show the anti-reflection layer 130 having a single-layered structure. Alternatively, the anti-reflection layer 130 may have a double-layered structure or a multiple layered structure.

The first electrode 140 includes the plurality of finger electrodes 141 extending in the first direction 'x' (or the x-axis direction) and the plurality of front bus bars 142 which are connected to the finger electrodes 141 and extend in the second direction 'y' (or the y-axis direction).

The first electrode 140 passes through the anti-reflection layer 130 and electrically contacts the heavily doped region 121H.

The finger electrodes 141 are electrically and physically connected to the finger doped regions 121HF of the emitter region 121 and are separated from one another. The finger electrodes 141 extend parallel to one another in a fixed direction. The finger electrodes 141 collect carriers (for example, electrons) moving to the emitter region 121.

The front bus bars 142 are electrically and physically connected to the bus bar doped regions 121HB of the emitter region 121 and extend parallel to one another in a direction crossing the finger electrodes 141.

In this instance, the front bus bars 142 are positioned on the same level layer as the finger electrodes 141 and are electrically and physically connected to the finger electrodes 141 at crossings of the finger electrodes 141 and the front bus bars 142.

Accordingly, as shown in FIG. 1, the plurality of finger electrodes 141 have a stripe shape extending in the first direction 'x', and the plurality of front bus bars 142 have a stripe shape extending in the second direction 'y'. Hence, the first electrode 140 has a lattice shape on the front surface of the substrate 110.

The front bus bars 142 collect not only carriers moving from the heavily doped region 121H of the emitter region 121 but also carriers collected by the finger electrodes 141, and transfer the collected carriers in a desired direction.

Each of the front bus bars 142 has to collect carriers collected by the finger electrodes 141 crossing the front bus bars 142 and has to move the collected carriers in a desired direction. Thus, a width of each front bus bar 142 may be greater than a width of each finger electrode 141.

Because most of carriers generally move along the surface of the emitter region 121, carriers positioned in the lightly doped region 121L move to the surface of the lightly doped region 121L and then move to the first electrode 140 along the surface of the lightly doped region 121L. In this instance, because the lightly doped region 121L has a thin impurity doping thickness, a moving distance of carriers moving to the surface of the lightly doped region 121L decreases. Thus, an amount of carriers collected by the first electrode 140 increases, and the efficiency of the solar cell 10 is improved.

Further, because the lightly doped region 121L corresponding to the incident surface has the low impurity doping concentration, a loss amount of carriers resulting from impurities decreases. Hence, an amount of carriers increases.

In addition, because the heavily doped region 121H, which contacts the first electrode 140 and outputs carriers, has the high impurity doping concentration, the heavily doped region 121H has the conductivity higher than the lightly doped region 121L and the sheet resistance less than the lightly doped region 121L. Therefore, the transfer efficiency of carriers from the lightly doped region 121L to the first electrode 140 is improved. As a result, the efficiency of the solar cell 10 is improved.

The front bus bars 142 are connected to an external device and output the collected carriers (for example, electrons) to the external device.

The first electrode 140 including the finger electrodes 141 and the front bus bars 142 is formed of at least one conductive material such as silver (Ag).

As described above, because the emitter region 121 has the selective emitter structure including the lightly doped region 121L and the heavily doped region 121H, the lightly doped region 121L transferring carriers to the first electrode 140 has the low impurity doping concentration, and the heavily doped region 121H contacting the first electrode 140 has the high impurity doping concentration. Thus, an amount of carriers moving to the first electrode 140 through the emitter region 121 increases, and also an amount of carriers collected by the first electrode 140 increases by an increase of the conductivity resulting from an increase in the concentration of the impurities. Hence, the efficiency of the solar cell 10 is improved.

In the embodiment of the invention, the number of finger electrodes 141 and the number of front bus bars 142 may vary, if necessary or desired.

The back surface field region 172 is a region (for example, a p+-type region) that is more heavily doped than the substrate 110 with impurities of the same conductive type as the substrate 110.

A potential barrier is formed by a difference between the impurity concentrations of the first conductive type region (for example, the p-type region) of the substrate 110 and the back surface field region 172. Hence, the potential barrier prevents or reduces electrons from moving to the back surface field region 172 used as a moving path of holes, and makes it easier for holes to move to the back surface field region 172.

Thus, the back surface field region 172 reduces an amount of carriers lost by a recombination and/or a disappearance of electrons and holes at and around the back surface of the substrate 110, and accelerates a movement of desired carriers (for example, holes), thereby increasing an amount of carriers moving to the second electrode 150.

The second electrode 150 includes a back electrode layer 151 and a plurality of back bus bars 152 connected to the back electrode layer 151.

The back electrode layer 151 contacts the back surface field region 172 positioned on the back surface of the substrate 110. The back electrode layer 151 is positioned on the entire back surface of the substrate 110 except an edge of the back surface of the substrate 110 and a formation portion of the back bus bars 152.

The back electrode layer 151 contains a conductive material such as aluminum (Al).

The back electrode layer 151 collects carriers (for example, holes) moving to the back surface field region 172.

Because the back electrode layer 151 contacts the back surface field region 172 having the impurity doping concentration higher than the substrate 110, a contact resistance between the back electrode layer 151 and the substrate 110 (i.e., the back surface field region 172) decreases. Hence, the transfer efficiency of carries from the substrate 110 to the back electrode layer 151 is improved.

The back bus bars 152 are positioned on the back surface of the substrate 110, on which the back electrode layer 151 is not positioned. The back bus bars 152 are connected to the back electrode layer 151.

The back bus bars 152 are positioned opposite the front bus bars 142 with the substrate 110 interposed between them.

The back bus bars 152 collect carriers transferred from the back electrode layer 151 in the same manner as the front bus bars 142.

The back bus bars 152 are connected to the external device and output the collected carriers (for example, holes) to the external device in the same manner as the front bus bars 142.

The back bus bars 152 may be formed of a material with the conductivity better than the back electrode layer 151. For example, the back bus bars 152 may contain at least one conductive material such as silver (Ag).

The solar cell 10 according to the embodiment of the invention further includes a plurality of middle doped regions 121M.

The middle doped regions 121M are formed in a portion between heavily doped regions 121H that are adjacent to each other. Each of the middle doped regions 121M has a third concentration that is lower than the second concentration of the heavily doped region 121H.

For example, as shown in FIGS. 3 and 4, the middle doped regions 121M may be formed between the bus bar doped regions 121HB in the first direction 'x' crossing the bus bar doped region 121HB.

More specifically, as shown in FIGS. 1 and 3, a crossing area C140 of the finger electrode 141 and the front bus bar 142 overlaps a crossing area CHD of the finger doped region 121HF and the bus bar doped region 121HB.

Herein, as shown in FIG. 4, each of the middle doped regions 121M may be formed between two crossing areas CHD that are adjacent to each other.

Each of the middle doped regions 121M may also be formed in the second direction 'y' crossing the finger doped region 121HF between two crossing areas CHD that are adjacent to each other.

The third concentration of the middle doped region 121M may be lower than the second concentration of the heavily doped region 121H and may be substantially equal to or higher than the first concentration of the lightly doped region 121L.

For example, when ions of the second conductive type impurities opposite the first conductive type impurities are implanted into the substrate 110 doped with the first conductive type impurities in an ion implantation process, the third concentration of the middle doped region 121M may be substantially equal to the first concentration of the lightly doped region 121L when the implanted ions and the substrate 110 exactly form a right angle.

On the other hand, when the implanted ions and the substrate 110 form not the right angle but an angle of inclination, the third concentration of the middle doped region 121M may be lower than the second concentration of the heavily doped region 121H, and may be higher than the first concentration of the lightly doped region 121L.

As shown in FIGS. 2 and 3, a thickness dMD of the middle doped region 121M may be greater than a thickness dLD of the lightly doped region 121L and may be less than a thickness dHD of the heavily doped region 121H.

As shown in FIG. 4, a width WMD1 of the middle doped region 121M formed in the portion between the bus bar doped regions 121HB, as measured in the first direction 'x', may be substantially equal to a width of the bus bar doped region 121HB. As shown in FIGS. 3 and 4, a width WMD2 of the middle doped region 121M, as measured in the second direction 'y', may be equal to or less than a width of the finger doped region 121HF.

FIG. 4 shows that one middle doped region 121M is formed between the two crossing areas CHD of the finger doped regions 121HF and the bus bar doped regions 121HB. Alternatively, the plurality of middle doped regions 121M may be formed between the two crossing areas CHD. In (a) of FIG. 4, one middle doped region 121M is formed between the two crossing areas CHD of the finger doped regions 121HF and the bus bar doped regions 121HB.

Further, a width and the number of the middle doped regions 121M crossing middle bus bar doped regions 121HB may be greater than a width and the number of the middle doped regions 121M crossing the outer bus bar doped regions 121HB. Also, in (b) of FIG. 4, the middle doped regions 121M interconnect the bus bar doped regions 121HB. That is, the middle doped regions 121M are interposed between the bus bar doped regions 121HB, in the in the second direction 'y'.

An operation of the solar cell 10 having the above-described structure is described below.

When light irradiated to the solar cell 10 is incident on the substrate 110, which is the semiconductor part, through the anti-reflection layer 130, electrons and holes are generated in the substrate 110 by light energy produced based on the incident light. In this instance, because a reflection loss of the light incident on the substrate 110 is reduced by the textured surface of the substrate 110 and the anti-reflection layer 130, an amount of light incident on the substrate 110 increases.

The electrons move to the n-type emitter region 121 and the holes move to the p-type substrate 110 by the p-n junction of the substrate 110 and the emitter region 121. The electrons moving to the emitter region 121 are collected by the finger electrodes 141 and the front bus bars 142, and then are transferred to the front bus bars 142. The holes moving to the substrate 110 are collected by the back electrode layer 151 and the back bus bars 152, and then are transferred to the back bus bars 152. When the front bus bars 142 are connected to the back bus bars 152 using electric wires, current flows therein to thereby enable use of the current for electric power.

A loss amount of carriers decreases and an amount of carriers moving to the first electrode 140 increases because of the emitter region 121 having the selective emitter structure. Hence, the efficiency of the solar cell 10 is greatly improved.

As described above, because the solar cell 10 according to the embodiment of the invention includes the emitter region 121 having the selective emitter structure, the photoelectric conversion efficiency of the solar cell 10 may be improved. Further, a process time of the solar cell 10 may be reduced.

Figures 5, 6:
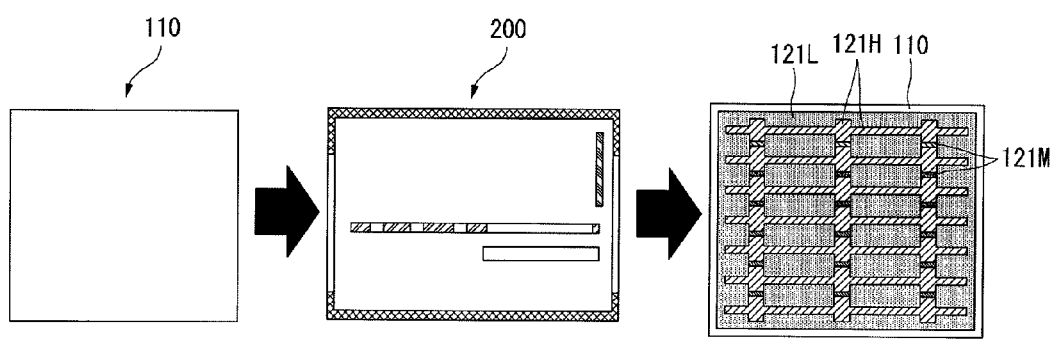
FIG. 5 is a table for explaining the efficiency of a solar cell according to an example embodiment of the invention.
FIG. 6 schematically illustrates a function of a solar cell manufacturing device according to an example embodiment of the invention.

FIG. 5 is a table for explaining the efficiency of the solar cell according to the embodiment of the invention.

In FIG. 5, a comparative example (1) indicates an example of a solar cell not having the selective emitter structure; a comparative example (2) indicates an example of a solar cell having the selective emitter structure in which an emitter region under a finger electrode is a heavily doped region; and a comparative example (3) indicates an example of a solar cell having the selective emitter structure in which an emitter region under a finger electrode and a front bus bar is a heavily doped region.

As shown in FIG. 5, because an open-circuit voltage Voc is mainly affected by an inner potential difference of the p-n junction, the open-circuit voltage Voc does not depend on whether or not the solar cell has the selective emitter structure. On the other hand, because a short circuit current Isc is affected by the transfer efficiency of carriers, the short circuit current Isc depends on whether or not the solar cell has the selective emitter structure.

Accordingly, the short circuit current Isc in the comparative example (1) not having the selective emitter structure has a small value, the short circuit current Isc in the comparative example (2) has a middle value, and the short circuit current Isc in the comparative example (3) has a good (or a relatively larger) value.

However, even when the solar cell includes the middle doped regions 121M in the selective emitter structure as in the embodiment of the invention, the middle doped regions 121M improve the transfer efficiency of carriers. Therefore, the solar cell according to the embodiment of the invention may have the excellent short circuit current Isc similar to the comparative example (3).

This is because the finger electrodes 141 or the front bus bars 142 are formed on the heavily doped region 121H.

More specifically, even if the middle doped region 121M having the relatively low doping concentration is formed in a portion between the heavily doped regions 121H, carriers moving to the heavily doped region 121H may move along the finger electrodes 141 or the front bus bars 142 having the conductivity better than the middle doped region 121M. Therefore, the solar cell according to the embodiment of the invention may have the excellent short circuit current Isc similar to the comparative example (3).

A solar cell manufacturing device used to manufacture the solar cell 10 according to the embodiment of the invention is described below with reference to FIGS. 6 to 8F.

As shown in FIG. 6, a solar cell manufacturing device 200 according to the embodiment of the invention may form the lightly doped region 121L, the heavily doped region 121H, and the middle doped region 121M of the emitter region 121 using one mask in one chamber.

Accordingly, because the solar cell manufacturing device 200 according to the embodiment of the invention does not need to separately have a mask for forming the lightly doped region 121L and a mask for forming the heavily doped region 121H, the manufacturing cost of the solar cell 10 may be further reduced.

Figure 7:
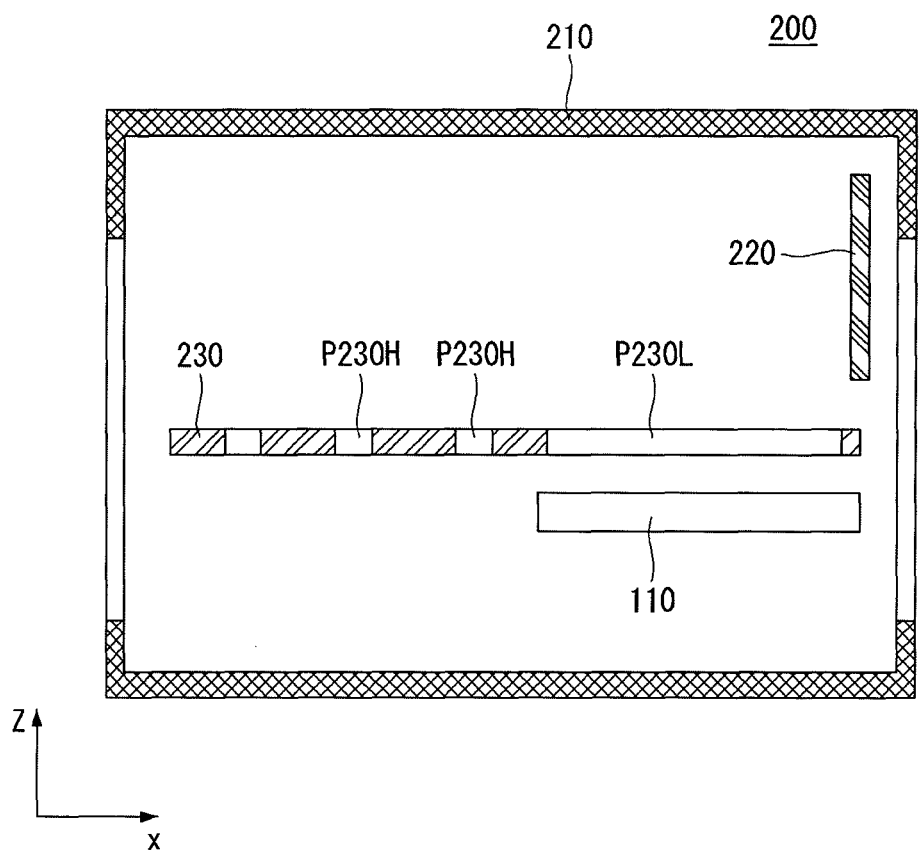
FIG. 7 schematically illustrates a configuration of a solar cell manufacturing device according to an example embodiment of the invention.

More specifically, FIG. 7 schematically illustrates a configuration of the solar cell manufacturing device according to the embodiment of the invention. FIGS. 8A to 8F illustrate various mask patterns to be used in the solar cell manufacturing device according to the embodiment of the invention.

As shown in FIG. 7, the solar cell manufacturing device 200 according to the embodiment of the invention includes a chamber 210, an ion implantation unit 220, and a mask 230.

The chamber 210 provides a space for implanting ions into one surface of the substrate 110. The space provided by the chamber 210 may be completely excluded (or sealed off) from the outside. The inside of the chamber 210 may be in a vacuum state when ions are implanted by the ion implantation unit 220.

A supporter, on which the substrate 110 inside the chamber 210 is positioned, may be formed inside the chamber 210.

The supporter may move during an implantation period of the ions.

The ion implantation unit 220 is positioned inside the chamber 210 and implants ions into one surface of the substrate 110 inside the chamber 210. Thus, the ion implantation unit 220 may implant ions of impurities of the second conductive type opposite the first conductive type into one surface of the substrate 110 doped with the first conductive type impurities.

The ion implantation unit 220 may include a plurality of nozzles therein and thus may have a bar form.

Further, the ion implantation unit 220 may move during the implantation period of the ions.

The mask 230 is positioned between the ion implantation unit 220 and the substrate 110. The mask 230 is separated from the substrate 110 before the substrate 110 moves to the inside of the chamber 210 and the ions are implanted into one surface of the substrate 110. When the ion implantation unit 220 implants the ions, a separation distance between the mask 230 and the substrate 110 may decrease, or the mask 230 may contact the substrate 110. The mask 230 may move during the implantation period of the ions performed by the ion implantation unit 220.

The mask 230 may contain a diamond like carbon (DLC) material.

The DLC material has a very high strength and thus resists an impact received from and/or heat generated when ions are implanted. Further, the DLC material is little or hardly deformed.

The mask 230 includes a first opening P230L used to form the lightly doped region 121L having the first concentration on one surface of the substrate 110 and a second opening P230H used to form the heavily doped region 121H having the second concentration higher than the first concentration.

As shown in FIGS. 8A to 8F, the first opening P230L and the second opening P230H may be separated from each other. An opening area of the first opening P230L may be greater than an opening area of the second opening P230H, and may be less than an area of one surface of the substrate 110.

Hence, the first opening P230L may entirely form the lightly doped region 121L at one surface of the substrate 110 except an edge of the substrate 110

As shown in FIGS. 8A to 8F, the second opening P230H may include a plurality of finger openings P230HF and a plurality of bus openings P230HB.

The plurality of finger openings P230HF are formed in the first direction 'x', and the plurality of bus openings P230HB are formed in the second direction 'y' crossing the first direction 'x'. The finger openings P230HF are connected to the bus openings P230HB.

The bus openings P230HB are used for the bus bar doped regions 121HB of the heavily doped region 121H of the emitter region 121 to be formed at one surface of the substrate 110. The finger openings P230HF are used for the finger doped regions 121HF of the heavily doped region 121H to be formed at one surface of the substrate 110.

A width W230B of the bus opening P230HB may be greater than a width W230F of the finger opening P230HF. Hence, a width WHB (refer to FIGS. 1 and 2) of each bus bar doped region 121HB formed at one surface of the substrate 110 may be greater than a width WHF (refer to FIGS. 1 and 2) of each finger doped region 121HF.

For example, the width W230F of the finger opening P230HF may be about 50 μm to 1 mm. The width W230B of the bus opening P230HB may be about 0.5 mm to 3 mm.

The mask 230 may further include an edge 230EG, a plurality of centers 230CF, and a connector CN.

The connector CN is formed to cross or divide the second opening P230H. The connector CN is configured so that the plurality of centers 230CF of the mask 230 are not separated from the mask 230.

More specifically, the connector CN may include a plurality of first connectors C1a and a plurality of second connectors C1b.

The connector CN may contain the same material (i.e., the DLC material) as the mask 230. Alternatively, the connector CN may contain SiN or SiO. Other materials may be used.

The edge 230EG surrounds the first opening P230L and the second opening P230H of the mask 230, and the centers 230CF are surrounded by the finger openings P230HF and the bus openings P230HB. The first connectors C1a connect the edge 230EG to the centers 230CF, and each of the second connectors C1b connects the two adjacent centers 230CF.

The second connectors C1b may be omitted in the embodiment of the invention. This is described later with reference to FIG. 8D.

The first connectors C1a and the second connectors C1b may be formed to cross the bus openings P230HB.

More specifically, the first connectors C1a may be formed to cross the bus openings P230HB in the first direction 'x', so as to connect the edge 230EG to the centers 230CF. The second connectors C1b may be formed to cross the bus openings P230HB in the first direction 'x', so as to connect the two directly adjacent centers 230CF.

Thus, the first connectors C1a and the second connectors C1b may reduce or prevent the plurality of centers 230CF from being separated from the mask 230.

Figure 8A:
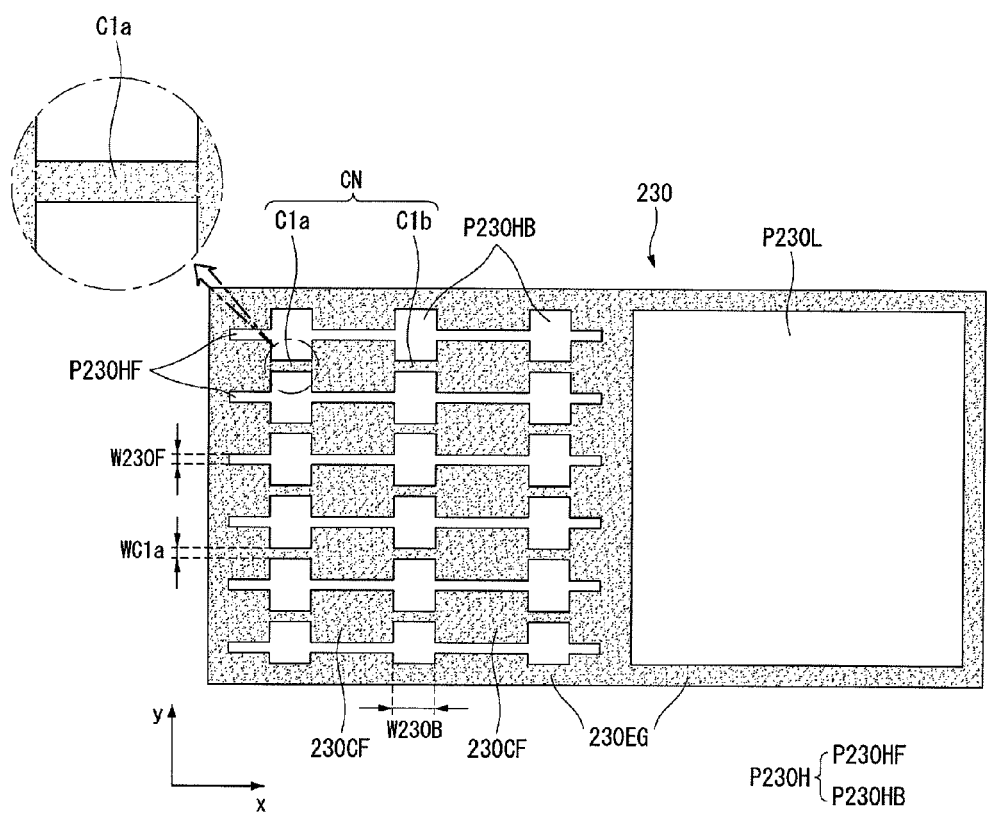
FIGS. 8A to 8F illustrate various mask patterns to be used in a solar cell manufacturing device according to an example embodiment of the invention.

As shown in FIG. 8A, the first connector C1a and the second connector C1b may be positioned between the two directly adjacent finger openings P230HF.

A width WC1a of each of the first connectors C1a may be equal to or less than the width W230F of the finger opening P230HF.

The middle doped regions 121M may be formed using the first connectors C1a. Hence, the middle doped region 121M may be formed in a portion between the heavily doped regions 121H formed at one surface of the substrate 110 to cross the heavily doped region 121H in the first direction 'x'.

The width WC1a of the first connector C1a may have a minimum value capable of reducing or preventing the center 230CF from being separated from the edge 230EG. For example, the width WC1a of the first connector C1a may be equal to or less than the width W230F of the finger opening P230HF.

For example, the width WC1a of the first connector C1a may be about 50 μm to 1 mm. Alternatively, the width WC1a of the first connector C1a may be less than about 50 μm or may be greater than about 1 mm in consideration of the strength of the DLC material contained in the first connector C1a.

FIG. 8A shows that one first connector C1a and one second connector C1b are formed between the two adjacent finger openings P230HF. Alternatively, the plurality of first connectors C1a and the plurality of second connectors C1b may be formed between the two directly adjacent finger openings P230HF.

If the plurality of first connectors C1a and the plurality of second connectors C1b are formed between the two adjacent finger openings P230HF, the centers 230CF may be more firmly connected to the edge 230EG. Hence, the centers 230CF may be reduced or prevented from hanging down or sagging due to the gravity.

Figure 8B:
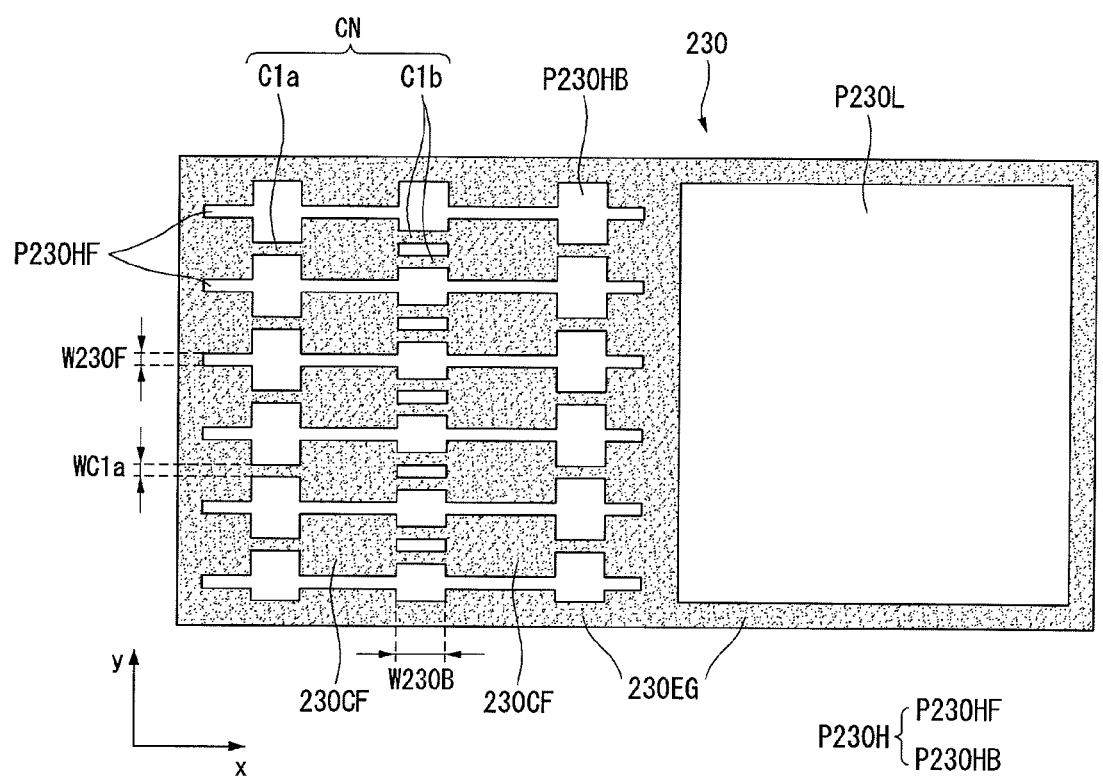

As shown in FIG. 8B, the number of second connectors C1b between the two adjacent finger openings P230HF may be more than the number of first connectors C1a between the two adjacent finger openings P230HF.

As above, when the number of second connectors C1b is more than the number of first connectors C1a, the centers 230CF of the mask 230 may be prevented from hanging down or sagging on the substrate 110 underlying the centers 230CF.

Figure 8C:
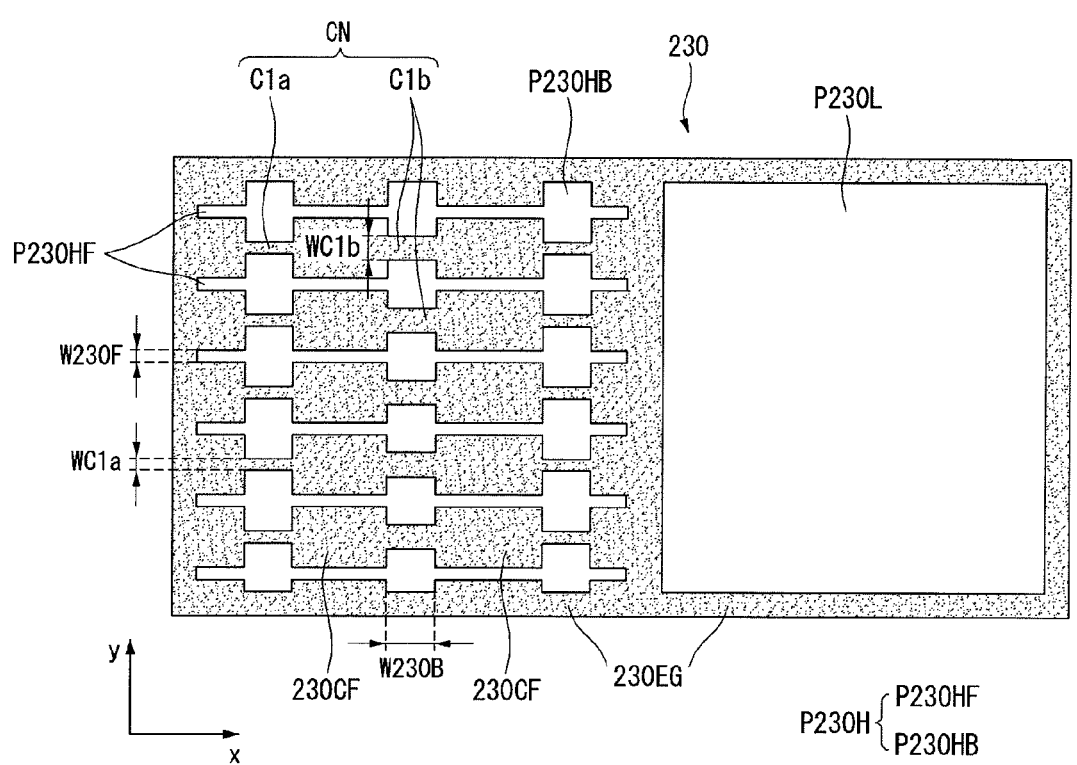

For this, as shown in FIG. 8C, a width WC1b of the second connector C1b may be greater than the width WC1a of the first connector C1a.

Figure 8D:
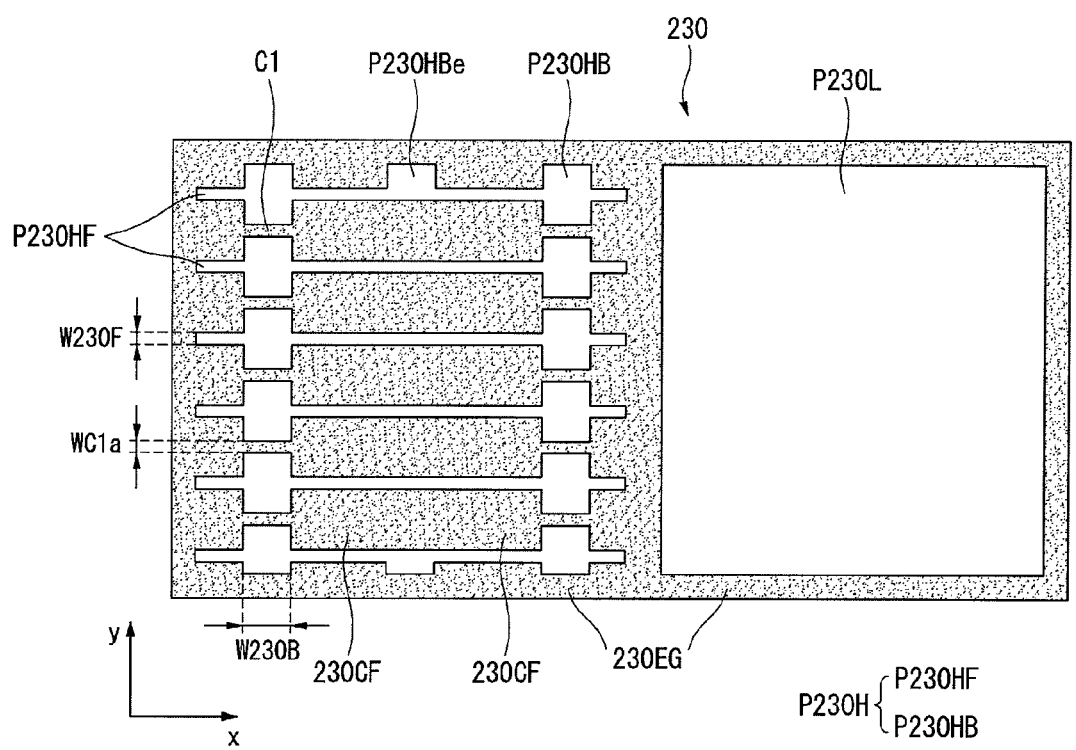

As shown in FIG. 8D, to ensure the centers 230CF of the mask 230 do not hang down or sag on the substrate 110, in a center of the mask 230, some of the bus opening P230HB and the second connector C1b positioned may be omitted. Further, the size of the center 230CF shown in FIG. 8D may be greater than the size of the center 230CF shown in FIG. 8A.

In this instance, an end P230HBe of the bus opening P230HB positioned outside the outer finger opening P230HF may remain. Alternatively, the end P230HBe of the bus opening P230HB may be omitted.

Figure 8E:
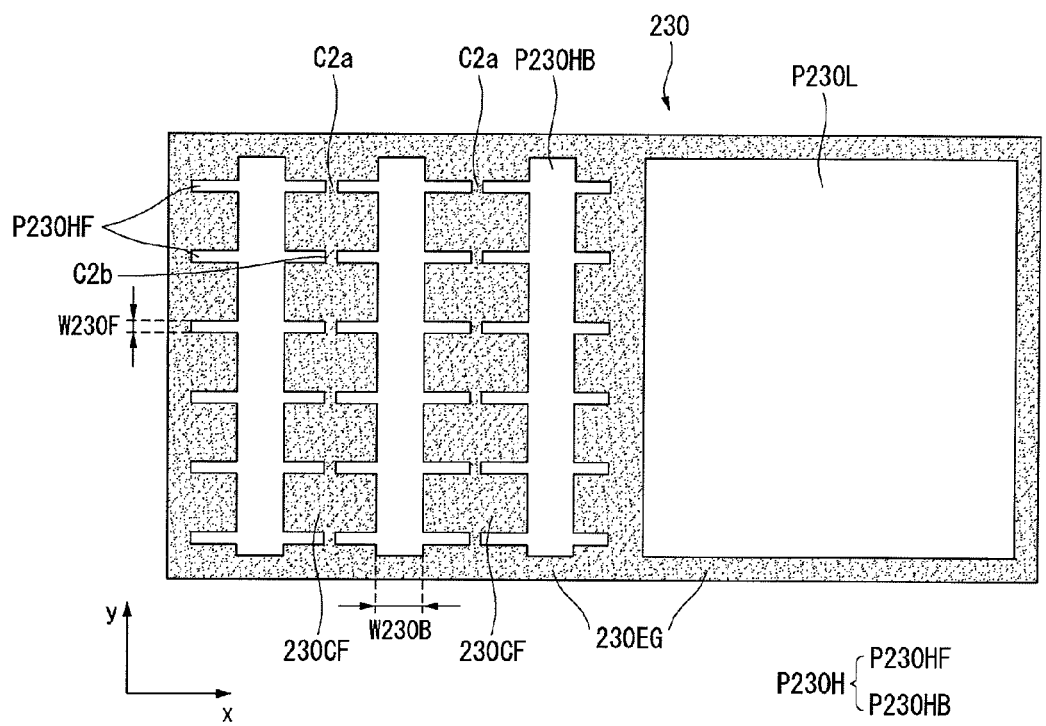
Figure 8F:
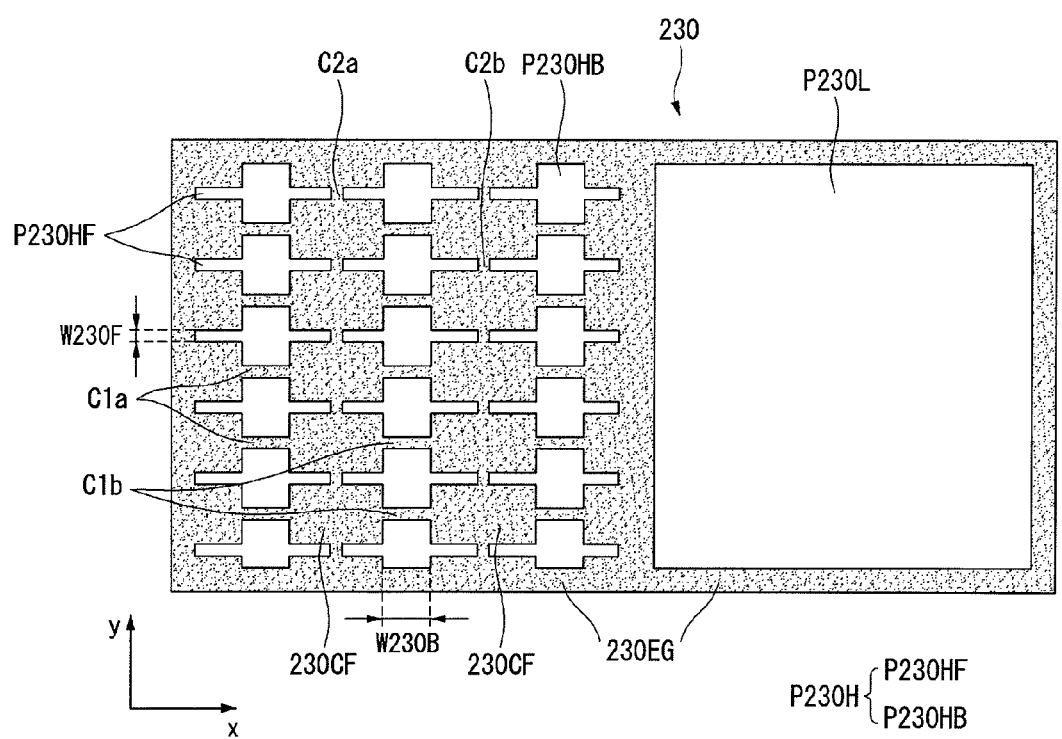

Although configurations shown in FIGS. 8E and 8F that are similar to the configurations shown in FIGS. 8B to 8D are not particularly described, all of the configurations shown in FIGS. 8B to 8D may be applied to the configurations shown in FIGS. 8E and 8F.

So far, the embodiment of the invention described the first and second connectors as being formed in the direction crossing the bus openings. However, as shown in FIG. 8E, first connectors C2a and second connectors C2b may be formed to cross the finger openings P230HF in the second direction 'y'.

More specifically, the first connector C2a and the second connector C2b may be positioned between the two directly adjacent bus openings P230HB in the second direction 'y' crossing the finger opening P230HF. Hence, the first connector C2a may connect the edge 230EG to the center 230CF. Further, the second connector C2b may connect the two directly adjacent centers 230CF to each other.

As shown in FIG. 8F, the first connectors C1a and C2a and the second connectors C1b and C2b may be formed in the first and second directions 'x' and 'y' crossing the finger openings P230HF and the bus openings P230HB.

More specifically, the first connectors C1a and C2a may be formed in the first and second directions 'x' and 'y' crossing the bus opening P230HB and the finger opening P230HF, respectively. Further, the second connectors C1b and C2b may be formed in the first and second directions 'x' and 'y' crossing the bus opening P230HB and the finger opening P230HF, respectively.

In this instance, the centers 230CF may be further efficiently prevented from hanging down or sagging due to the gravity.

A method for manufacturing the solar cell 10 using the solar cell manufacturing device 200 according to the embodiment of the invention is described below.

FIGS. 9A to 9F illustrate a method for manufacturing the solar cell using the solar cell manufacturing device according to the embodiment of the invention.

Figure 9A:
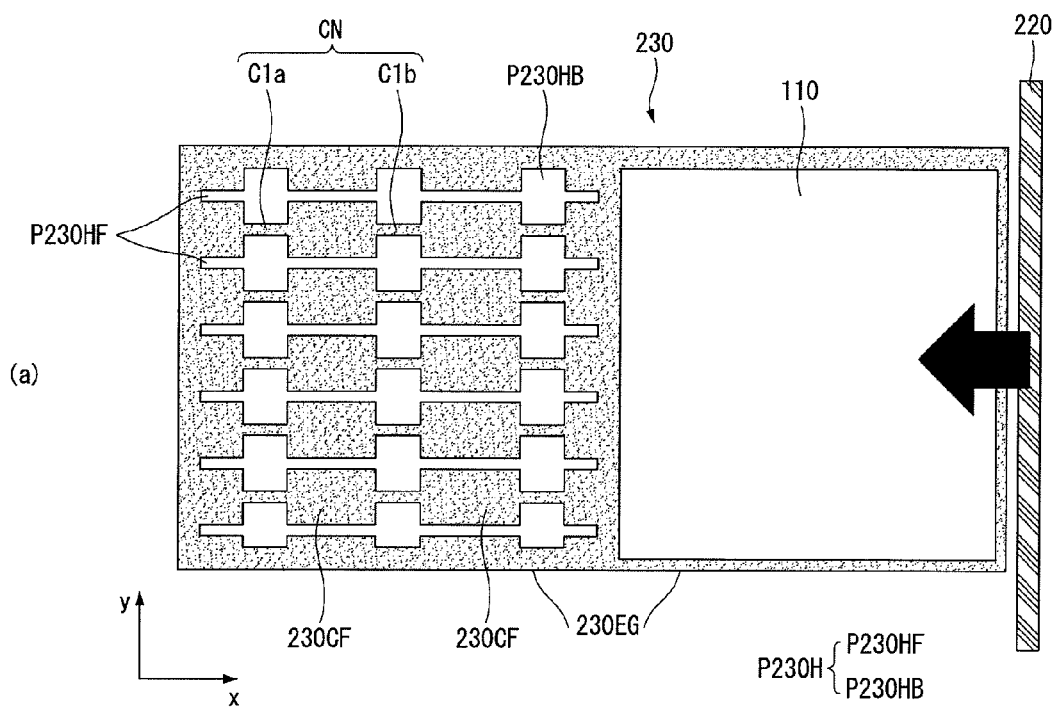
FIGS. 9A to 9F illustrate a method for manufacturing a solar cell using a solar cell manufacturing device according to an example embodiment of the invention.
Figure 9A:
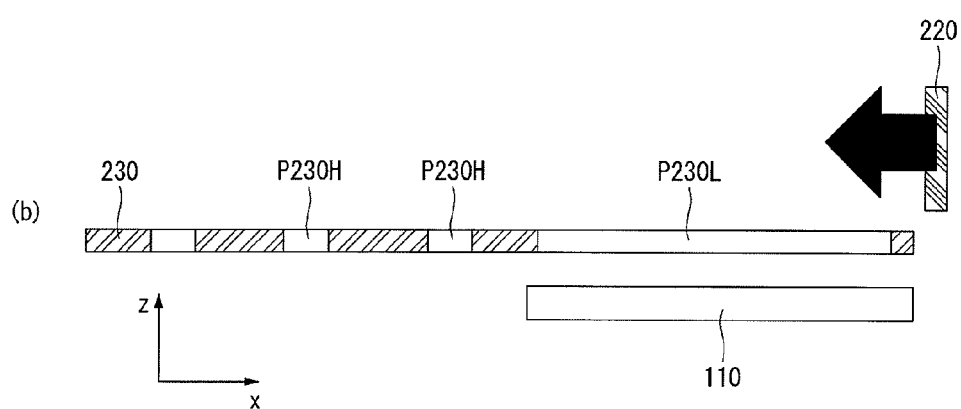

In FIG. 9A, (a) shows the solar cell manufacturing device 200 when viewed from above, and (b) shows the solar cell manufacturing device 200 when viewed from the side.

The method for manufacturing the solar cell 10 according to the embodiment of the invention is described based on FIGS. 7 and 8A.

Because the method for manufacturing the solar cell 10 according to the embodiment of the invention moves only the ion implantation unit 220 in a state where the mask 230 is fixed, the chamber 210 does not need to provide a movable space of the mask 230.

First, as shown in FIG. 9A, while the ion implantation unit 220 moves in an arrow direction parallel to the extending direction (i.e., the first direction 'x') of the finger openings P230HF of the mask 230 in a state where the substrate 110 is disposed under the first opening P230L of the mask 230, the ion implantation unit 220 implants ions into the substrate 110. Hence, the lightly doped region 121L is formed at one surface of the substrate 110.

In this instance, energy for implanting ions by the ion implantation unit 220 may be determined between about 5 keV and 20 keV.

As described above, the ion implantation unit 220 moves while implanting ions into the one surface of the substrate 110 underlying the first opening P230L. When the ion implantation unit 220 is positioned between the first opening P230L and the second opening P230H, the ion implantation unit 220 stops moving.

Figure 9B:
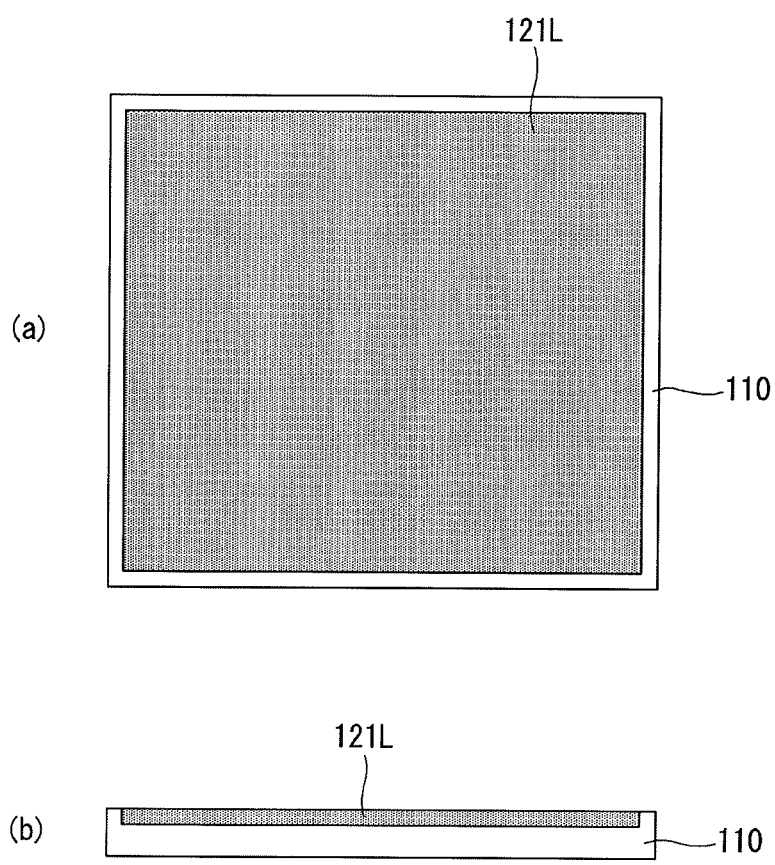

Hence, as shown in FIG. 9B, the lightly doped region 121L is entirely formed at the one surface of the substrate 110 except the edge of the substrate 110.

Figure 9C:
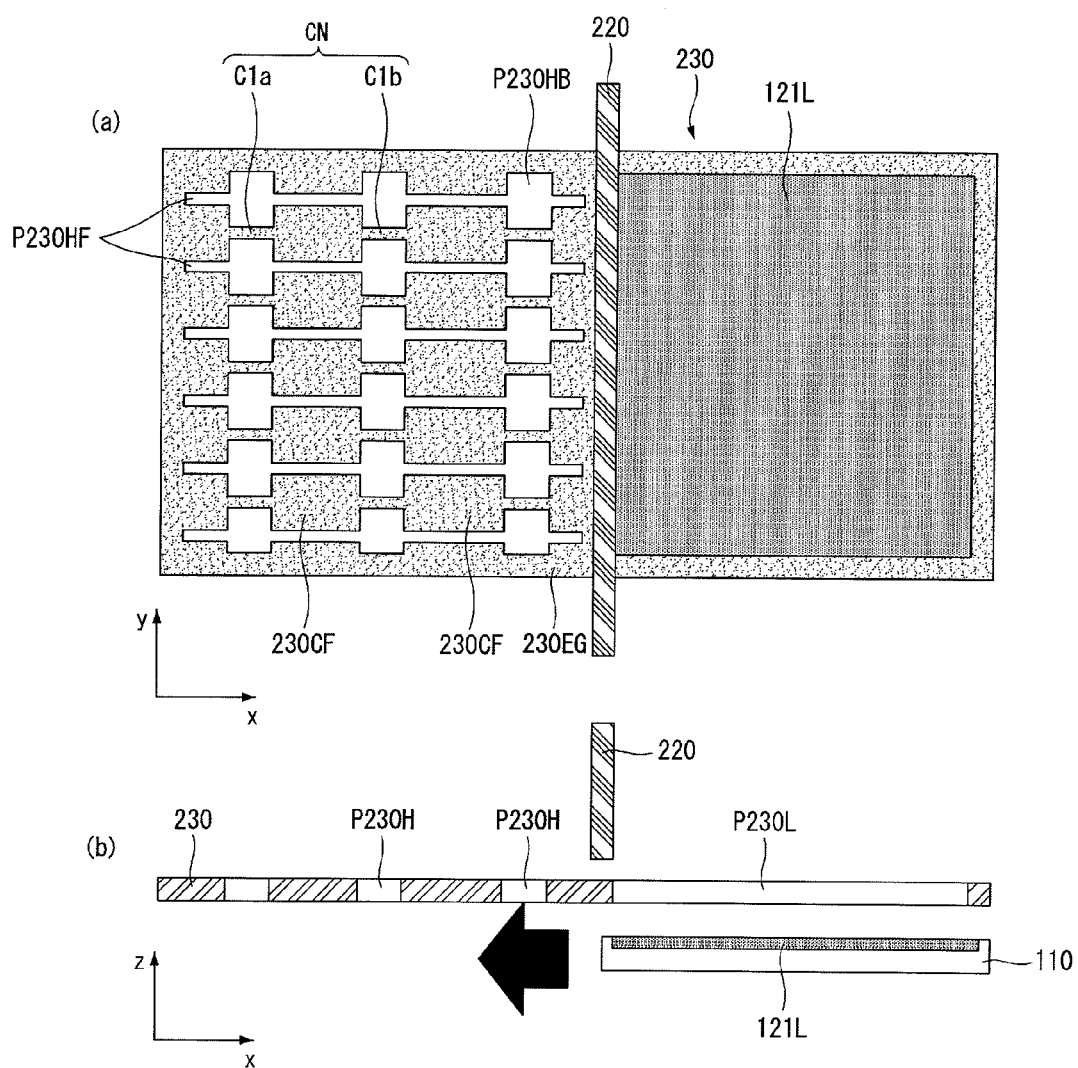

Next, as shown in FIG. 9C, the substrate 110 moves in the first direction 'x' in a state where the ion implantation unit 220 and the mask 230 are fixed. Hence, the substrate 110 is positioned under the second opening P230H of the mask 230.

Figure 9D:
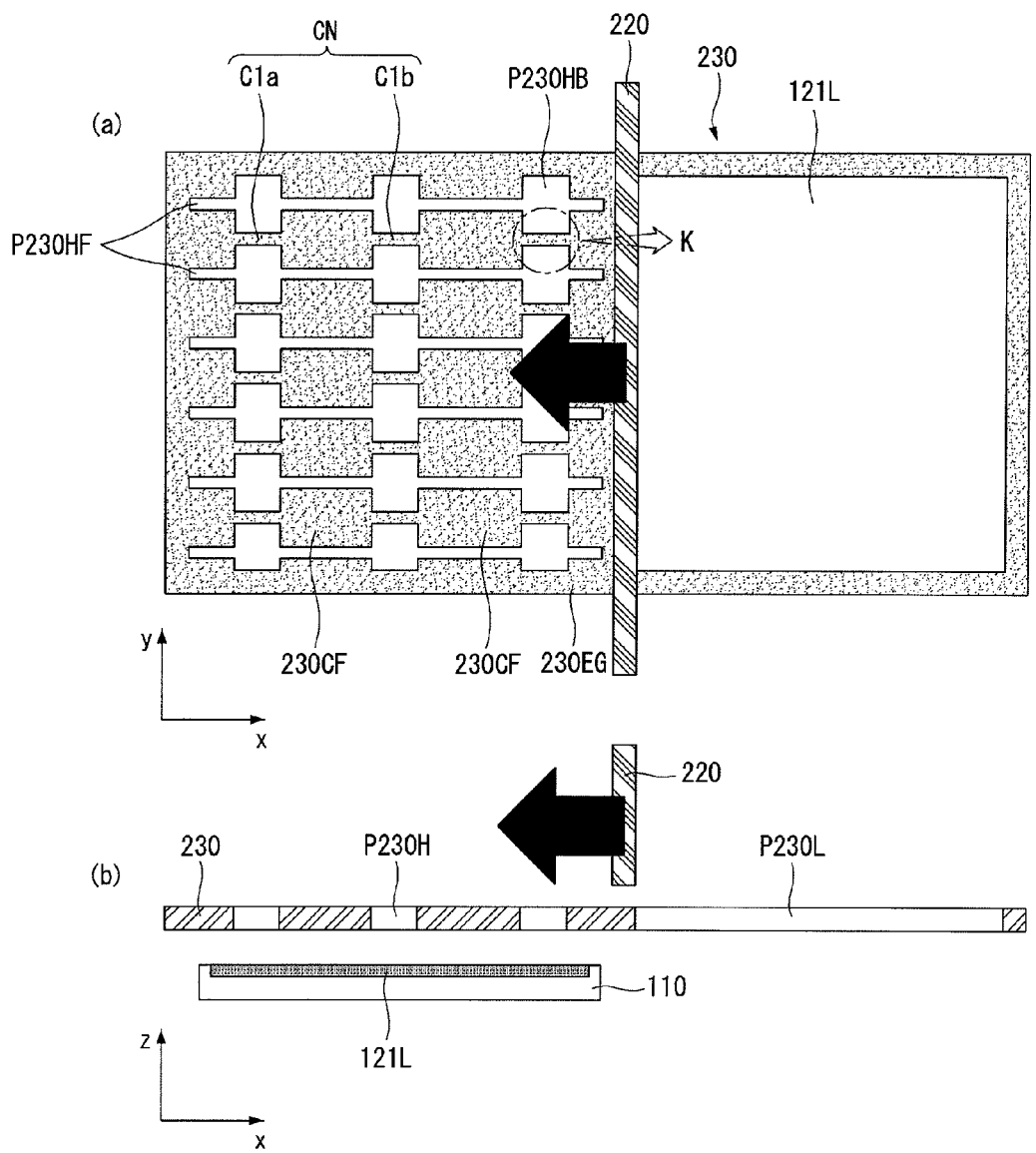

Next, as shown in FIG. 9D, when the substrate 110 is positioned under the second opening P230H of the mask 230, the ion implantation unit 220 implants ions into the substrate 110 while again moving in the arrow direction (i.e., the first direction 'x'). Hence, the heavily doped region 121H extending in the first direction 'x' and the heavily doped region 121H extending in the second direction 'y' crossing the first direction 'x' are simultaneously formed at the one surface of the substrate 110 at which the lightly doped region 121L is formed.

Figure 9E:
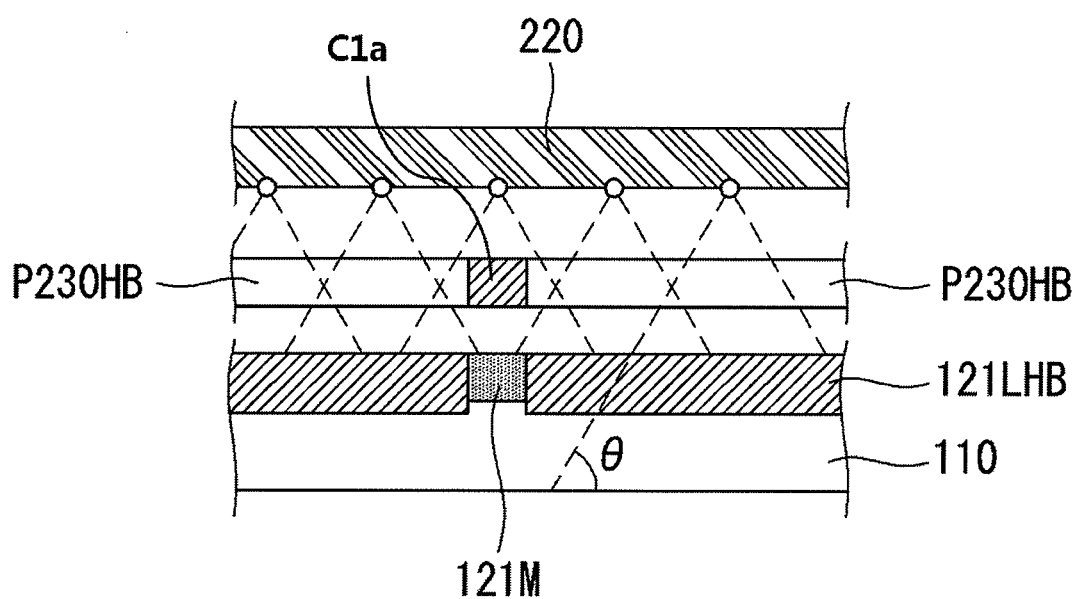

As shown in FIG. 9E, when viewing a portion K shown in FIG. 9D in the first direction 'x', an implantation angle of the ions to the substrate 110 is not exactly 90° and may be less than 90°. Therefore, some of the ions may be implanted into a portion of the substrate 110 underlying the first and second connectors C1a (or C1b). Hence, an amount of ions implanted into the portion of the substrate 110 underlying the first and second connectors C1a and C1b may be less than an amount of ions implanted into a portion of the substrate 110 underlying the bus opening P230HB and the finger opening P230HF.

Accordingly, the portion of the substrate 110 underlying the first and second connectors C1a and C1b may have a third concentration lower than a second concentration of the heavily doped region 121H and higher than a first concentration of the lightly doped region 121L.

Figure 9F:
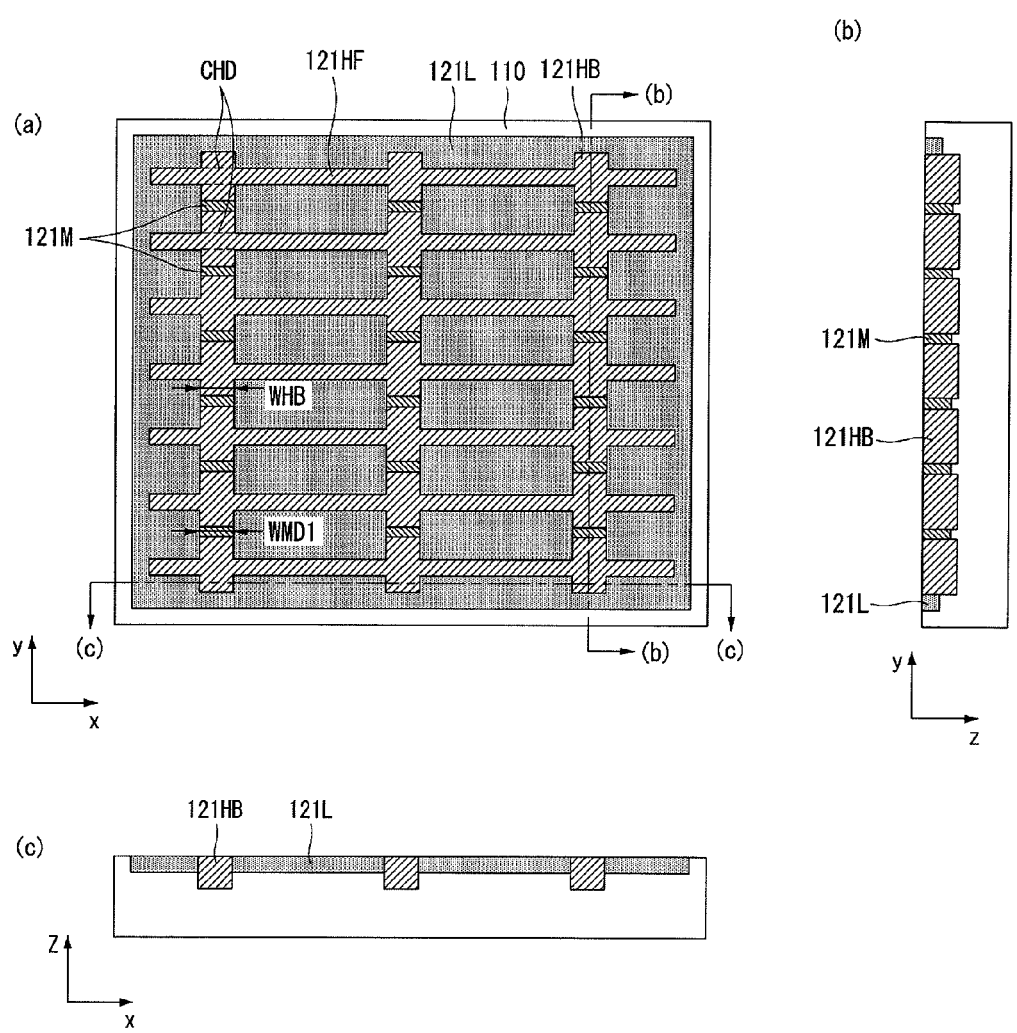

As shown in FIG. 9F, the lightly doped region 121L is entirely formed at the one surface of the substrate 110, and the finger doped regions 121HF and the bus bar doped regions 121HB of the heavily doped region 121H are formed in conformity with a pattern of the first electrode 140 including the finger electrodes 141 and the front bus bars 142. Further, the middle doped region 121M may be formed in a portion between the bus bar doped regions 121HB to cross the bus bar doped regions 121HB. Hence, the middle doped region 121M may have a concentration lower than the second concentration of the bus bar doped regions 121HB and higher than the first concentration of the lightly doped region 121L.

The method for manufacturing the solar cell 10 illustrated in FIGS. 9A to 9F was described based on FIGS. 7 and 8A. However, the method for manufacturing the solar cell 10 illustrated in FIGS. 9A to 9F may use one of the configurations of the mask 230 shown in FIGS. 8B to 8F.

As described above, the method for manufacturing the solar cell 10 according to the embodiment of the invention may simultaneously form the lightly doped region 121L and the heavily doped region 121H at one surface of the substrate 110 using the solar cell manufacturing device 200 including the mask 230 having both the first opening P230L and the second opening P230HB. Therefore, the solar cell manufacturing device 200 according to the embodiment of the invention does not need to separately have a mask for forming the lightly doped region 121L and a mask for forming the heavily doped region 121H, and also the mask does not need to be replaced or changed out. As a result, the process efficiency of the solar cell 10 may be further improved, and the process time may be further reduced.

Further, the method for manufacturing the solar cell 10 according to the embodiment of the invention moves the ion implantation unit 220 on the entire mask 230 in the first direction 'x' only once. Therefore, the ion implantation unit 220 does not need to repeatedly move on the mask 230. Hence, the process time of the solar cell 10 may be further reduced.

FIGS. 10A to 10D illustrate another method for manufacturing the solar cell using the solar cell manufacturing device according to the embodiment of the invention.

Figure 10A:
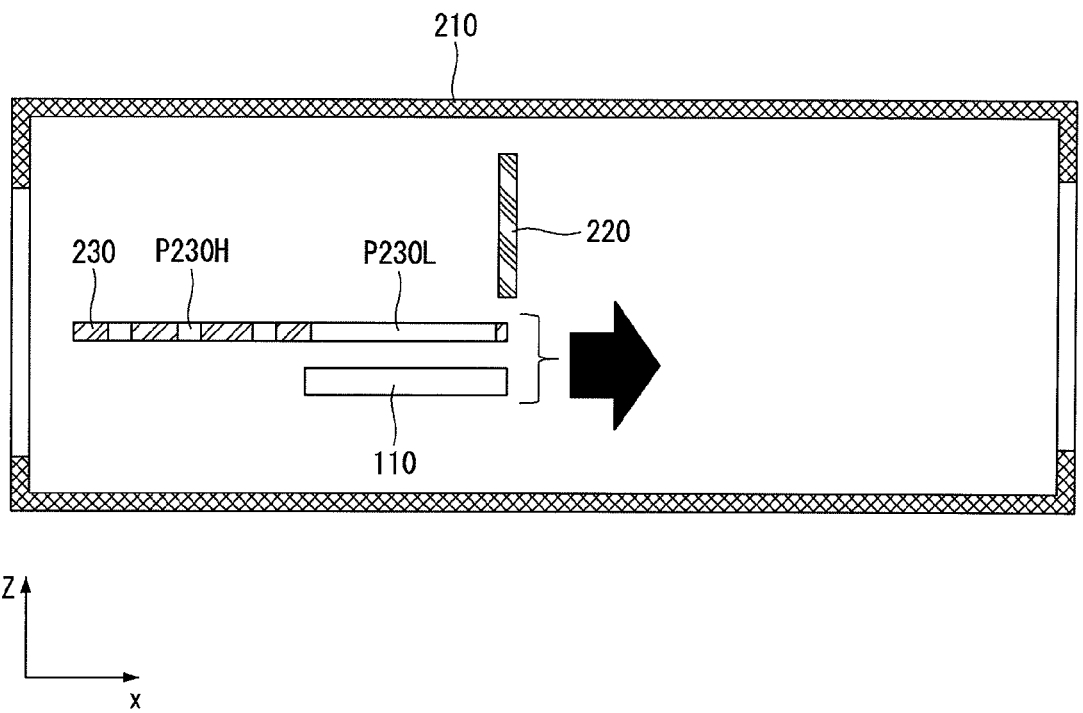
FIGS. 10A to 10D illustrate another method for manufacturing a solar cell using a solar cell manufacturing device according to an example embodiment of the invention.

First, as shown in FIG. 10A, the method for manufacturing the solar cell 10 according to the embodiment of the invention moves the mask 230 and the substrate 110 in a state where the ion implantation unit 220 is fixed. Therefore, the chamber 210 separately provides a movable space of the mask 230. However, because the ion implantation unit 220 does not move, a skill for moving the ion implantation unit 220 is not necessary.

Figure 10B:
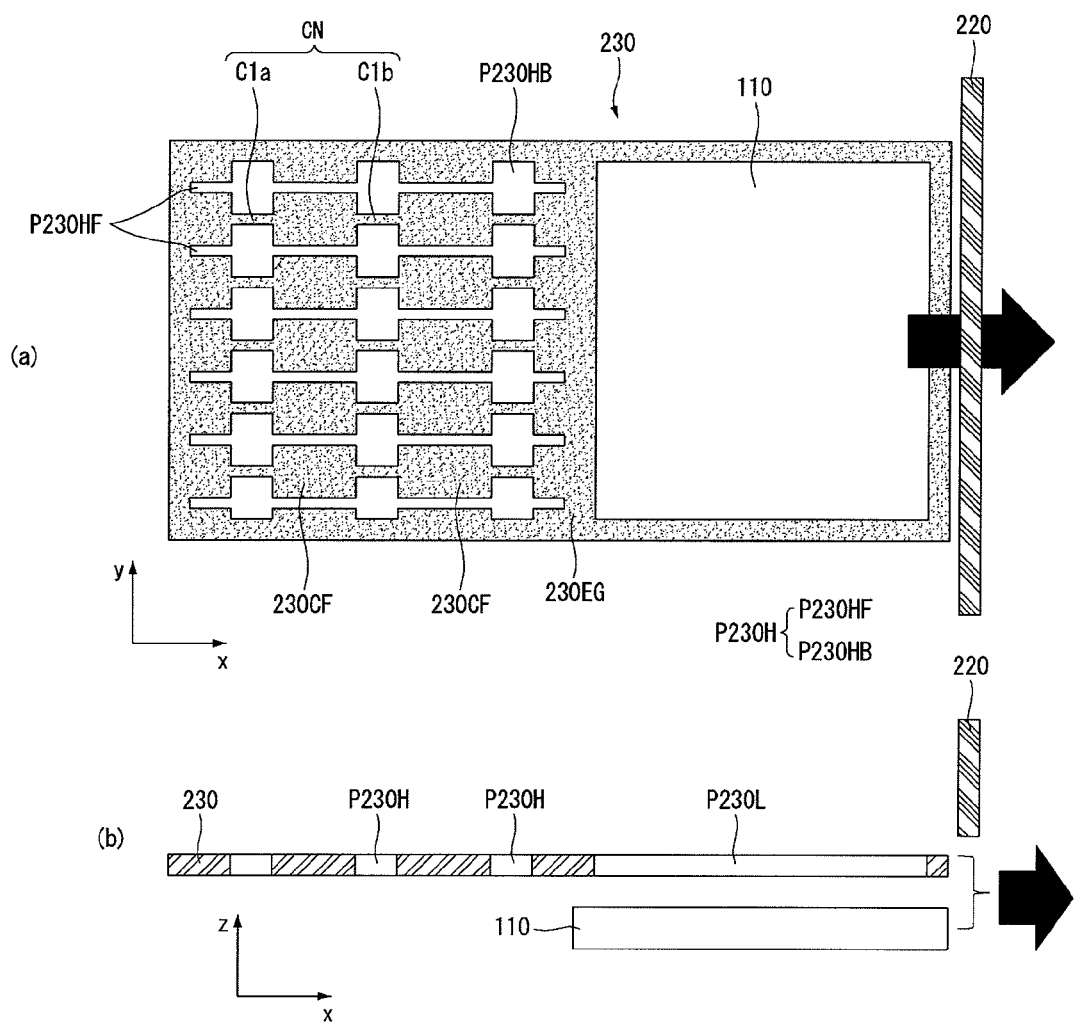

Next, as shown in FIG. 10B, while the ion implantation unit 220 implants ions into the substrate 110 in a state where the substrate 110 is disposed under the first opening P230L of the mask 230, the substrate 110 and the mask 230 simultaneously move in the first direction 'x'. Hence, the lightly doped region 121L is formed at one surface of the substrate 110.

Accordingly, the lightly doped region 121L is entirely formed at the one surface of the substrate 110 except the edge of the substrate 110 as shown in FIG. 9B.

Figure 10C:
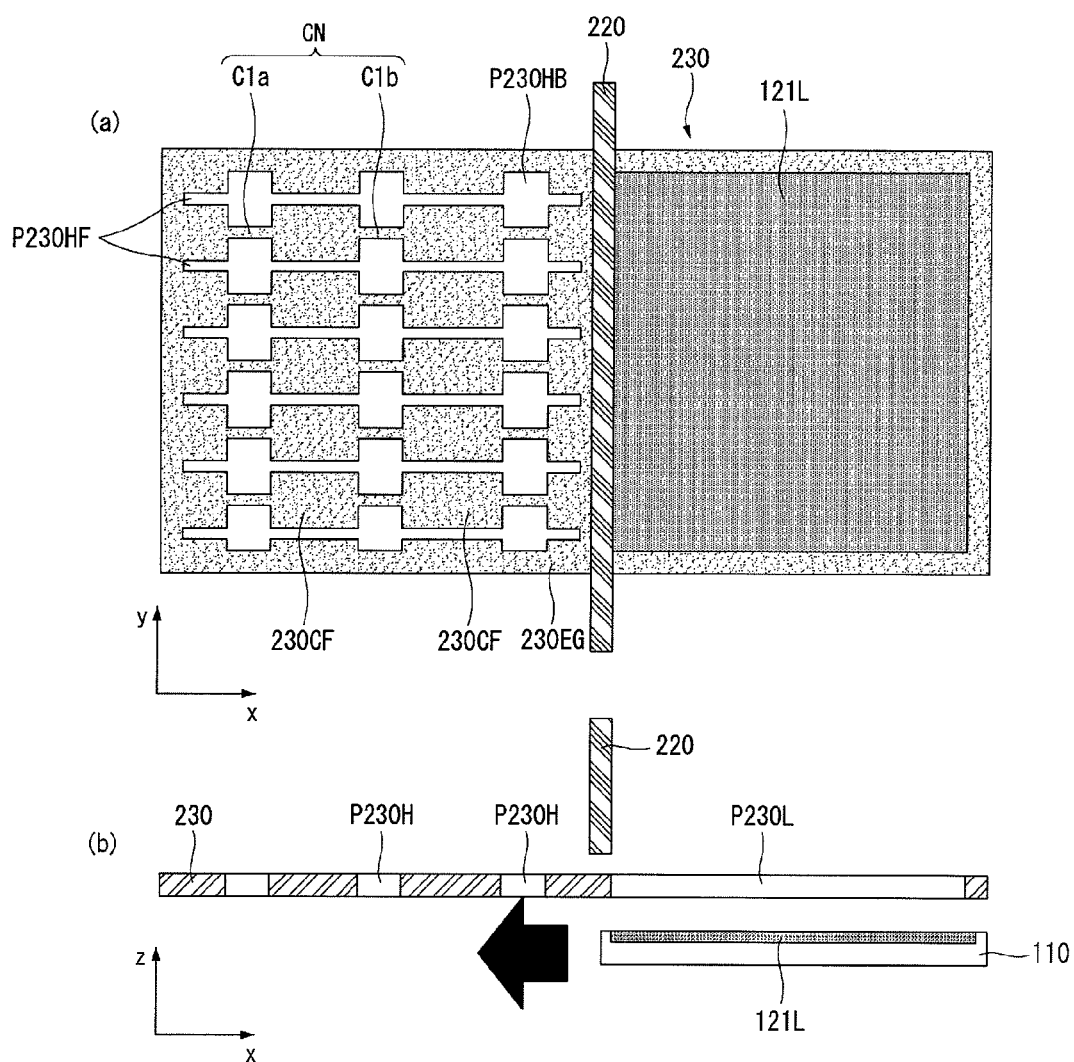

Next, as shown in FIG. 10C, the substrate 110 moves in the opposite direction to the moving direction of the mask 230 in a state where the ion implantation unit 220 and the mask 230 are fixed. Hence, the substrate 110 is positioned under the second opening P230H of the mask 230.

Figure 10D:
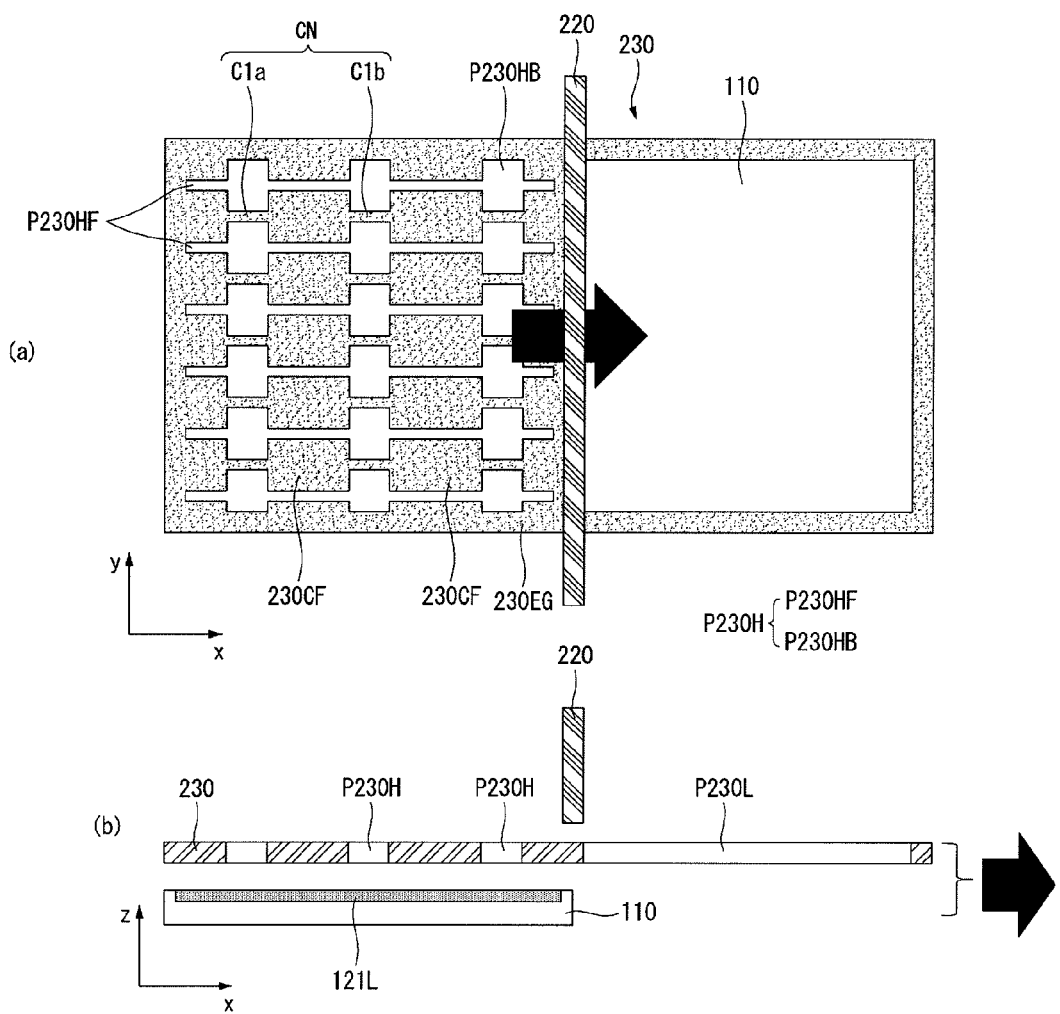

Next, as shown in FIG. 10D, while the ion implantation unit 220 implants ions into the substrate 110 in a state where the substrate 110 is positioned under the second opening P230H of the mask 230, the substrate 110 and the mask 230 simultaneously move in the first direction 'x'. Hence, the heavily doped region 121H extending in the first direction 'x' and the heavily doped region 121H extending in the second direction 'y' crossing the first direction 'x' are simultaneously formed at the one surface of the substrate 110 at which the lightly doped region 121L is formed.

Accordingly, as shown in FIG. 9F, the lightly doped region 121L is entirely formed at the one surface of the substrate 110, and the finger doped regions 121HF and the bus bar doped regions 121HB of the heavily doped region 121H are formed in conformity with a pattern of the first electrode 140 including the finger electrodes 141 and the front bus bars 142. Further, the middle doped region 121M may be formed in a portion between the bus bar doped regions 121HB to cross the bus bar doped regions 121HB. Hence, the middle doped region 121M may have a concentration lower than the second concentration of the bus bar doped regions 121HB and higher than the first concentration of the lightly doped region 121L.

The method for manufacturing the solar cell 10 illustrated in FIGS. 10A to 10D was described using the mask 230 shown in FIG. 8A. However, the method for manufacturing the solar cell 10 illustrated in FIGS. 10A to 10D may use one of the configurations of the mask 230 shown in FIGS. 8B to 8F.

As described above, the method for manufacturing the solar cell 10 illustrated in FIGS. 10A to 10D may simultaneously form the lightly doped region 121L and the heavily doped region 121H at one surface of the substrate 110 using the solar cell manufacturing device 200 including the mask 230 having both the first opening P230L and the second opening P230H in the same manner as FIGS. 9A to 9F. Therefore, the process efficiency of the solar cell 10 may be further improved, and the process time may be further reduced.

Further, the method for manufacturing the solar cell 10 illustrated in FIGS. 10A to 10D moves the mask 230 and the substrate 110 in the first direction 'x' only, once in a state where the ion implantation unit 220 is fixed. Therefore, the mask 230 and the substrate 110 do not need to repeatedly move. Hence, the process time of the solar cell 10 may be further reduced.

Furthermore, because the solar cell manufacturing device 200 according to the embodiment of the invention may repeatedly use the mask 230, the manufacturing cost may be further reduced.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell manufacturing device comprising:
   a chamber;
   an ion implantation unit which is positioned inside the chamber and configured to implant ions into one surface of a substrate positioned inside the chamber; and
   a mask positioned between the ion implantation unit and the substrate, the mask including a first opening to form a lightly doped region having a first concentration at the one surface of the substrate, a second opening to form a heavily doped region having a second concentration higher than the first concentration at the one surface of the substrate, and at least one connector formed to cross the second opening, wherein the second opening includes a plurality of finger openings formed in a first direction, and a plurality of bus openings which are formed in a second direction crossing the first direction and are connected to the finger openings.

2. The solar cell manufacturing device of claim 1, wherein the mask further includes:

an edge surrounding the first opening and the second opening; and a plurality of centers surrounded by the plurality of finger openings and the plurality of bus openings.

3. The solar cell manufacturing device of claim 2, wherein the at least one connector of the mask includes first connectors connecting the edge to the plurality of centers.

4. The solar cell manufacturing device of claim 3, wherein the at least one connector of the mask includes second connectors connecting directly adjacent centers to each other.

5. The solar cell manufacturing device of claim 4, wherein the first connectors and the second connectors are formed to cross at least one of the finger openings and the bus openings.

6. The solar cell manufacturing device of claim 4, wherein the first connectors and the second connectors are positioned between the two directly adjacent finger openings or between the two directly adjacent bus openings.

7. The solar cell manufacturing device of claim 4, wherein at least one first connector and at least one second connector are positioned between two directly adjacent finger openings.

8. The solar cell manufacturing device of claim 4, wherein at least one first connector and at least one second connector are positioned between two directly adjacent bus openings.

9. The solar cell manufacturing device of claim 4, wherein the number of the second connectors is more than the number of the first connectors.

10. The solar cell manufacturing device of claim 3, wherein a width of the first connectors is equal to or less than a width of the finger openings.

* * * * *